(12) United States Patent
Soeno et al.

(10) Patent No.: US 8,531,857 B2
(45) Date of Patent: *Sep. 10, 2013

(54) POWER SUPPLY DEVICE AND METHOD FOR DRIVING THE SAME

(75) Inventors: Akitaka Soeno, Toyota (JP); Jun Saito, Nagoya (JP); Gehan Anil Joseph Amaratunga, Cambridge (GB); Florin Udrea, Cambridge (GB)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 647 days.

This patent is subject to a terminal disclaimer.

(21) Appl. No.: 12/677,131

(22) PCT Filed: Aug. 28, 2008

(86) PCT No.: PCT/JP2008/065463
§ 371 (c)(1),
(2), (4) Date: May 27, 2010

(87) PCT Pub. No.: WO2009/034851
PCT Pub. Date: Mar. 19, 2009

(65) Prior Publication Data
US 2010/0283514 A1    Nov. 11, 2010

(30) Foreign Application Priority Data
Sep. 10, 2007    (JP) ................. 2007-234063

(51) Int. Cl.
*H02M 7/5387*    (2007.01)
(52) U.S. Cl.
USPC ............ 363/132; 327/108; 327/110; 257/577

(58) Field of Classification Search
USPC ................ 363/125, 126, 127, 132; 327/112, 327/427, 432, 109, 110; 257/133, 139, 140, 257/146, 577
See application file for complete search history.

(56) References Cited

U.S. PATENT DOCUMENTS

| | | | |
|---|---|---|---|
| 5,737,200 A | * | 4/1998 | Miyashita et al. ......... 363/56.03 |
| 6,069,371 A | | 5/2000 | Omura et al. |

(Continued)

FOREIGN PATENT DOCUMENTS

| | | |
|---|---|---|
| EP | 2 200 081 | 6/2010 |
| JP | 61-124178 | 6/1986 |

(Continued)

*Primary Examiner* — Nguyen Tran
(74) *Attorney, Agent, or Firm* — Finnegan, Henderson, Farabow, Garrett & Dunner, LLP

(57) ABSTRACT

In a reverse conducting semiconductor device, which forms a composition circuit, a positive voltage that is higher than a positive voltage of a collector electrode may be applied to an emitter electrode. In this case, in a region of the reverse conducting semiconductor device in which a return diode is formed, a body contact region functions as an anode, a drift contact region functions as a cathode, and current flows from the anode to the cathode. When a voltage having a lower electric potential than the collector electrode is applied to the trench gate electrode at that time, p-type carriers are generated within the cathode and a quantity of carriers increases within the return diode. As a result, a forward voltage drop of the return diode lowers, and constant loss of electric power can be reduced. Electric power loss can be reduced in a power supply device that uses such a composition circuit in which a switching element and the return diode are connected in reverse parallel.

13 Claims, 17 Drawing Sheets

(56) References Cited

U.S. PATENT DOCUMENTS

| | | |
|---|---|---|
| 7,382,116 B2 | 6/2008 | Endo et al. |
| 7,482,659 B2 * | 1/2009 | Hotta ............................ 257/355 |
| 7,498,634 B2 | 3/2009 | Tsuzuki et al. |
| 7,737,491 B2 * | 6/2010 | Hotta et al. .................... 257/330 |
| 7,751,207 B2 * | 7/2010 | Schreiber et al. ................ 363/17 |
| 7,880,200 B2 | 2/2011 | Hille et al. |
| 8,097,901 B2 | 1/2012 | Koyama et al. |
| 8,120,098 B2 | 2/2012 | Arai et al. |
| 8,248,116 B2 | 8/2012 | Soeno et al. |
| 2005/0017290 A1 | 1/2005 | Takahashi et al. |
| 2005/0258493 A1 | 11/2005 | Aono et al. |
| 2007/0170549 A1 | 7/2007 | Tsuzuki et al. |

FOREIGN PATENT DOCUMENTS

| | | |
|---|---|---|
| JP | 1-104748 | 7/1989 |
| JP | 11-146640 | 5/1999 |
| JP | 2000-14127 | 1/2000 |
| JP | 2000-245137 | 9/2000 |
| JP | 2003-60208 | 2/2003 |
| JP | 2005-317751 | 11/2005 |
| JP | 2006-121863 | 5/2006 |
| JP | 2006-210526 | 8/2006 |
| JP | 2006-344779 | 12/2006 |
| JP | 2007-14059 | 1/2007 |
| JP | 2007-37255 | 2/2007 |
| JP | 2007-214541 | 8/2007 |
| JP | 2007-221922 | 8/2007 |
| WO | WO 2009/034851 | 3/2009 |

* cited by examiner

POWER SUPPLY DEVICE AND METHOD FOR DRIVING THE SAME

CROSS-REFERENCE TO RELATED APPLICATION

This application is a national phase application of International Application No. PCT/JP2008/065463, filed Aug. 28, 2008, and claims priority to Japanese Patent Application No. 2007-234063, filed on Sep. 10, 2007, the contents of both of which are hereby incorporated by reference into the present application.

BACKGROUND OF THE INVENTION

1. Field of the Invention

The present invention relates to a power supply device that supplies power to an electrical load such as a motor, and a method for driving the same.

2. Description of the Related Art (Explanation of a Power Supply Device for which the Present Invention is Useful)

A known example of a power supply device is shown in FIGS. 8A to 8F. A power supply device 80 of FIG. 8A is a device for supplying power to a motor M. The power supply device 80 is provided with a series circuit A in which two switching elements A1 and A2 are connected in series and a series circuit B in which two switching elements B1 and B2 are connected in series. The series circuits A and B are connected in parallel. The aforesaid parallel circuit is connected between a pair of terminals, c and d, of a direct current power source S. An intermediate electric potential point a between the switching elements A1 and A2 of the series circuit A is connected to one of the power supply points of the motor M. An intermediate electric potential point b between the switching elements B1 and B2 of the series circuit B is connected to the other power supply point of the motor M.

FIG. 8B shows a state in which power is supplied to the motor M, wherein the switching elements B1 and A2 are in an on-state, and the switching elements A1 and B2 are in an off-state. In this case, current is supplied to the motor M in the direction indicated by an arrow. FIG. 8E shows another state in which power is supplied to the motor M, wherein the switching elements A1 and B2 are in the on-state, and the switching elements B1 and A2 are in the off-state. In this case, current is supplied to the motor M in the direction indicated by an arrow. The power supply device 80 is able to switch the direction in which the power is supplied to the motor M.

FIG. 8A shows an intermediate stage of switching from FIG. 8B to FIG. 8E. In FIG. 8A, the switching element A2 that had been in the on-state in FIG. 8B is switched to the off-state. Subsequently, as a result of the switching element B1 being switched off and the switching elements A1 and B2 being switched on, the state is switched to the state shown in FIG. 8B. The states of those switching elements that are switched between the on-state and off-state are indicated in boxes to facilitate easy understanding.

Upon switching from the state shown in FIG. 8B to the state shown in FIG. 8A when the current flowing to the motor M suddenly becomes zero, a high voltage is generated due to a reactance component of the motor M. It is possible that this high voltage destroys the switching elements A1, A2, B1 and B2 by acting thereon. In order to avoid this, a diode is connected in reverse parallel to the switching element A1. When a diode is connected in reverse parallel to the switching element A1, the motor current continues to flow as indicated by an arrow of FIG. 8A, thereby making it possible to prevent the high voltage from acting on the switching elements A1, A2, B1 and B2. The diode connected in reverse parallel to the switching element is referred to as a return diode, and current that continues to flow even after the switching element A2 has switched to the off-state is referred to as a return current. The return diode is required to have a low forward voltage drop.

As shown in FIG. 8A, when the state of FIG. 8E is realized by switching the switching element A1 to the on-state under a condition in which the return current is flowing to the return diode connected in reverse parallel to the switching element A1, a reverse recovery current flows to the return diode to which the aforesaid return diode has flown. When a large reverse recovery current flows, a high voltage is imposed on the switching elements A1, A2, B1 and B2, resulting in the possibility of damage thereof. A technology is required that reduces the reverse recovery current that flows to the return diode to a low level.

The description above has provided an explanation of the return current that flows when the state of FIG. 8B is changed to the state of FIG. 8E through the state of FIG. 8A. However, situations in which the return current flows are not limited thereto.

A technology is known for regulating a root-mean-square (RMS) current supplied to the motor M by repeatedly switching between the state of FIG. 8B and the state of FIG. 8A. If the duration of the state of FIG. 8B is long and the duration of the state of FIG. 8A is short, a large current passes through the motor M. If the duration of the state of FIG. 8B is short and the duration of the state of FIG. 8A is long, a small current passes through the motor M. The return current also flows when realizing the state in FIG. 8A in order to control electric current.

RMS current supplied to the motor M can be adjusted sinusoidally by repeatedly switching between the state of FIG. 8B and the state of FIG. 8A. The direction of current supplied to the motor M can be inverted by switching between the state of FIG. 8B and the state of FIG. 8E. Combination of the aforesaid two makes it possible to apply alternating current to the motor M. The power supply device 80 can also be said as a conversion device that converts a direct current to an alternating current.

When switching from the state of FIG. 8A to the state of FIG. 8B, the reverse recovery current flows to the return diode to which the return current had previously been flowing. When such a large reverse recovery current flows, a high voltage acts on the switching elements A1, A2, B1 and B2 resulting in the possibility of the destruction thereof. A technology is required that reduces reverse recovery current flowing to the return diode to a low level.

In the case of switching the current direction by switching from the state of FIG. 8B to the state of FIG. 8E, the state of FIG. 8B may be switched to the state of FIG. 8E via the state of FIG. 8C. Switching between FIG. 8B and FIG. 8C may alternately be repeated to control the electric current. In the case of FIG. 8C, the return current flows to a return diode connected in reverse parallel to the switching element B2.

In the case of changing the current direction by switching from the state of FIG. 8E to the state of FIG. 8B, FIG. 8E may be switched to FIG. 8B via the state of FIG. 8D; alternately, FIG. 8E may be switched to FIG. 8B via FIG. 8F. In order to control the electric current, FIG. 8E and FIG. 8D may be switched repeatedly, and FIG. 8E and FIG. 8F may alternately be switched repeatedly. In the case of FIG. 8D, the return current flows to a return diode connected in reverse parallel to the switching element B1, and in the case of FIG. 8F, the return current flows to a return diode connected in reverse parallel to the switching element A2.

In any case, the return diode is required to have a low forward voltage drop, and it is necessary to reduce the reverse recovery current that flows to the return diode to a low level.

FIGS. 9A to 9I, 10A to 10I and 11A to 11I indicate examples of power supply devices for a three-phase motor. In each of these power supply devices, phase of current passing through the motor M can be switched by switching in the order of B, E and H of each drawing. During switching of the phase, the state switches to the state of A or C, D or F, or G or I of each drawing. Alternatively, the state switches to the state of either: A or C, D or F, or G or I of each drawing to adjust the RMS current magnitude that passes through the motor M. When switching to the state of A or C, D or F, or G or I of each drawing by switching off a switching element that had previously been on, the return current flows to the return diode. The switching elements are protected from the high voltage acting thereon by directing the return current to flow to the return diode. In any of these power supply devices, since the return current flows to the return diode when switching to the either state of A or C, D or F, or G or I as in the respective drawing, the return diode is required to have a low forward voltage drop. Since the reverse recovery flows to the return diode in any of the power supply devices when switching to either state of B, E or H from A or C, D or F, or G or I of each drawing, it is necessary to reduce the reverse recovery order to a low level.

In any of the power supply devices of FIGS. 9A to 9I, 10A to 10I and 11A to 11I, a three-phase alternating current is provided to the motor M by combining switching of the current direction and adjustment of the RMS current. All of these power supply devices are conversion devices that convert direct current to the three-phase alternating current.

All of the power supply devices shown in FIGS. 8A to 8F, 9A to 9I, 10A to 10I and 11A to 11I are each provided with switching elements and composition circuits connected in reverse parallel to the switching element. In each of these power supply devices, the plurality of composition circuits are connected in series, and a plurality of such series circuits are connected in parallel. The aforesaid parallel circuit is connected between a pair of power supply terminals, and intermediate electric potential points between the composition circuits of each series circuit are connected to a load. The power supply devices provide electric power from a power source to the load. The power supply devices switch the direction in which power is supplied to the load, or adjust the amount of the RMS current supplied to the load.

The plurality of switching elements switches states according to the following rules:

(1) a switching element on one side of an intermediate electric potential point of one series circuit is switched to the on-state;

(2) a switching element on another side of the intermediate electric potential point of the series circuit of (1) above is switched to the off-state;

(3) a switching element on one side of an intermediate electric potential point of at least one of the other series circuits is switched to the off-state; and, (4) a switching element on another side of the intermediate electric potential point of the series circuit of (3) above is switched to the on-state, so that electric power is supplied from the power supply to the load via the two switching elements switched to the on-state of (1) and (4).

In the case of FIG. 9B, for example, C1 is switched on according to (1), C2 is switched off according to (2), both A1 and B1 are switched off according to (3), and both A2 and B2 are switched on according to (4). In the case of FIG. 10B, C1 and B1 are switched on according to (1), C2 and B2 are switched off according to (2), A1 is switched off according to (3), and A2 is switched on according to (4). In the case of FIG. 11B, C1 is switched on according to (1), C2 is switched off according to (2), A1 is switched off according to (3), and A2 is switched on according to (4). In the case of FIG. 11, both B1 and B2 are switched off according to (1), (2) and (3) respectively.

In the case of FIGS. 9 and 10, one switching element can be in the on-state on one side while two switching elements can be switched to the on-state on another side, or two switching elements can be in the on-state on one side while one switching element is switched to the on-state on another side. As shown in FIG. 11, the electric power can be supplied to the load if a switching element on aforesaid another side is switched on in at least one series circuit that differs from a series circuit in which a switching element on one side is switched on.

In this type of power supply device, the direction in which electric power is supplied to the load can be sequentially switched by sequentially changing the series circuit in which a switching element on one side is to be switched to the on-state according to (1) above. In the case of FIGS. 9 and 10, a rotating magnetic field can be created in the three-phase motor M by switching in an order of B, E and H.

When a switching element having been switched to the on-state according to (1) above is switched to the off-state, the return current flows to the return diode connected in reverse parallel to a switching element according to (2) above.

In the case of FIG. 8, when A2 switched on in FIG. 8B is switched off, as to the state of FIG. 8A, the return current flows to the return diode connected in reverse parallel to the switching element A1 as in (2) above. If B1 switched on in FIG. 8B is switched off to the state of FIG. 8C, the return current flows to the return diode connected in reverse parallel to the switching element B2 as in (2) above.

In the case of FIG. 9, when C1 switched on in FIG. 9B is switched off to the state of FIG. 9A, the return current flows to the return diode connected in reverse parallel to the switching element C2 as in (2) above. When A2 and B2 switched on in FIG. 9B are switched off to the state of FIG. 9C, the return current flows to the return diodes connected in reverse parallel to the switching elements A1 and B1 as in (2) above respectively.

In the case of FIG. 10, when B1 and C1 switched on in FIG. 10B are switched off to the state of FIG. 10A, the return current flows to the return diode connected in reverse parallel to the switching elements B2 and C2 as in (2) above. When A2 switched on in FIG. 10B is switched off to the state of FIG. 10C, the return current flows to the return diode connected in reverse parallel to the switching element A1 as in (2).

Although the power supply devices of FIGS. 8A to 8F, 9A to 9I, 10A to 10I and 11A to 11I can also be configured by using a composition circuit combining a switching element and a diode, a power supply device can also be produced by combining semiconductor devices in each of which an IGBT domain and a diode element domain coexist in a same semiconductor substrate. The semiconductor device in which the IGBT domain and the diode element domain coexist in the same semiconductor substrate is referred to as a reverse conducting semiconductor device.

(Characteristics Required of Power Supply Device)

If the forward voltage drop of the return diode is large, a constant loss increases and the return diode generates heat. The return diode is required to have a small forward voltage drop. The amount of the voltage drop of the return diode can be decreased by increasing impurity concentrations of an anode and a cathode.

On the other hand, the reverse recovery current flows to the return diode. If the impurity concentrations of the anode and the cathode of the return diode are increased in order to decrease the forward voltage drop, a reverse recovery loss of the return diode increases. If the impurity concentrations of the anode and the cathode are increased, a large quantity of p-type carriers accumulate in the cathode and a large quantity of n-type carriers accumulate in the anode when a forward voltage is applied. When a reverse voltage is applied to the return diode, i.e., when the cathode is connected to a high electric potential side and the anode is connected to a low electric potential side, the p-type carriers within the return diode flow in the direction of the anode, while the n-type carriers flow in the direction of the cathode, thereby resulting in the flow of reverse recovery current. In the case of increasing the impurity concentrations of the anode and the cathode, the quantity of p-type carriers that accumulate in the cathode and the quantity of n-type carriers that accumulate in the anode increase, resulting in the flow of large reverse recovery current. If such a large reverse recovery current flows, a large amount of heat is generated, and electric power is consumed. Moreover, in the case where the current amount exceeds a permissible current of the diode, the return diode is destroyed. By lowering the impurity concentrations of the anode and the cathode, the reverse recovery current can be held to a low level and the reverse recovery loss can be reduced, however, the forward voltage drop as a result becomes large.

Both the constant loss and the reverse recovery loss of the return diode cannot be decreased even by tuning the characteristics of the return diode.

Japanese Patent Application Publication No. 2005-317751 (steady-state 1) discloses a technology that uses a lifetime control to reduce the reverse recovery loss. According to this technology in the aforesaid patent document 1, a low lifetime layer is formed on an impurity injection domain corresponding to the anode and/or the cathode. In the case the low lifetime layer is formed on the cathode, the quantity of p-type carriers that have accumulated in the cathode dissipates in a short period of time after completion of the application of a forward voltage. Similarly, in the case the low lifetime layer is formed on the anode, the quantity of n-type carriers that have accumulated in the anode dissipates in a short period of time. As a result, the reverse recovery current can be decreased, and the reverse recovery loss can be reduced.

BRIEF SUMMARY OF THE INVENTION

Use of the technology of the prior art as described above makes it possible to reduce reverse recovery loss. By being able to reduce the reverse recovery loss, impurity concentrations of the anode and the cathode can be increased, and the constant loss can also be reduced.

Although the technology that uses lifetime control is an effective technology, there are limits on its effect. In the case of further increasing the impurity concentrations of the anode and the cathode, the quantity of p-type carriers that accumulates in the cathode and the quantity of n-type carriers that accumulates in the anode can no longer be limited. The reverse recovery loss thus can no longer be reduced. There are limitations on effectively reducing both the constant loss and the reverse recovery loss by providing a low lifetime layer.

Furthermore, in the case of configuring a power supply device using reverse conducting semiconductor devices in each of which the IGBT domain and the diode element domain coexist in the same semiconductor substrate, it is difficult to form the low lifetime layer by selecting the diode element domain. In addition, even in the case of configuring a power supply device using the reverse conducting semiconductor devices, there are limitations on effectively reducing both the constant loss and the reverse recovery loss.

The present teachings are created based on the recognition of the above-mentioned problems. In the present teachings, a technique is realized that enables both the constant loss and the reverse recovery loss of the return diode to be reduced in power supply devices that use composition circuits in each of which the switching element and the return diode are formed in reverse parallel.

Further, a technique that enables the magnitude of reverse recovery current to be held to a low level even if the power supply device is configured using reverse conducting semiconductor devices is provided.

The present teachings may be embodied in a method for driving a power supply device configured with a combination of a plurality of reverse conducting semiconductor devices in each of which an IGBT domain and a diode element domain coexist in a same semiconductor substrate.

The IGBT domain of the reverse conducting semiconductor device includes an emitter region, a body region, a drift region and a collector region being layer-stacked, and a trench gate electrode that penetrates the body region separating the emitter region and the drift region.

The diode element domain of the reverse conducting semiconductor device includes a body contact region, a body region, a drift region and a drift contact region being layer-stacked, and a trench gate electrode extending from a surface to the drift region. The body contact region is one of an anode region and a cathode region, while the drift contact region is another thereof If the body contact region is the anode region, then the drift contact region is the cathode region, while if the body contact region is the cathode region, then the drift contact region is the anode region.

The body region of the IGBT domain and the body region of the diode element domain are preferably shared. Similarly, the drift region of the IGBT domain and the drift region of the diode element domain are also preferably shared. In this case, the emitter region and the body contact region are of the opposite conductivity, and the collector region and the drift contact region are also of the opposite conductivity.

The following provides an explanation using an example of a power supply device provided with reverse conducting semiconductor devices, each of which includes a body region containing a p-type impurity and a drift region containing an n-type impurity. In the case of a power supply device provided with reverse conducting semiconductor devices, each of which includes a body region containing an n-type impurity and a drift region containing a p-type impurity, the polarity of a voltage applied to the trench gate electrodes is inverted relative to below.

In this power supply device, when supplying power to a load by switching the IGBT region to the on-state, a first polarity voltage, which in this case is a positive voltage, is applied to the trench gate electrodes. Power is supplied to the load by switching the IGBT domains of at least two reverse conducting semiconductor devices to the on-state.

In this power supply device, when the IGBT domain that had been in the on-state is switched to the off-state, return current flows to the diode element domain(s) of the rest of the reverse conducting semiconductor device(s) (i.e., other reverse conducting semiconductor device(s)). In the driving method of the present teachings, when the return current flows to the diode element domain(s) of the other reverse conducting semiconductor device(s) as a result of switching the IGBT domain having been in the on-state to the off-state, a second polarity voltage, which in this case is a negative voltage, is applied to the trench gate electrode(s) of the reverse conducting semiconductor device(s) to which the return current flows.

With the negative voltage applied to the trench gate electrode(s) while the return current flows to the diode element domain(s) of the reverse conducting semiconductor device(s), holes are induced at sites facing the trench gate electrode(s) of the drift region(s). As a result, the holes injected from the body region into the drift region increase, and the forward voltage drop of the diode element domain becomes smaller. With the negative voltage applied to the trench gate electrode(s) while the return current flows to the diode element domain, the forward voltage drop of the diode element domain becomes smaller, and a constant loss can be reduced.

In the case of applying the negative voltage to the trench gate electrode upon the return current flowing to the diode element domain of the reverse conducting semiconductor device(s), prior to switching the IGBT domain(s), which had caused the return current to flow due to their transition from the on-state to the off-state, back to the on-state, it is preferable to stop applying the negative voltage to the trench gate electrode(s) of the reverse conducting semiconductor device(s) to which the return current is now flowing.

When the IGBT domain(s) are switched back to the on-state while the negative voltage is applied to the trench electrode(s), the reverse recovery current that flows upon the switch to the on-state increases. If the application of the negative voltage to the trench gate electrode(s) of the reverse conducting semiconductor device(s) to which the return current is flowing is stopped, or in other words, when a zero or positive voltage is applied to the trench gate electrode(s), the reverse recovery current that flows upon the IGBT domain(s) being switched back to the on-state can be held to a low level.

As has been described above, although it is preferable to stop the application of the negative voltage to the trench gate electrode(s) of the reverse conducting semiconductor device(s), which had caused the flow of the return current, and to which the return current has been flowing when its/their IGBT domain(s) are switched back to the on-state; apart from the aforesaid configuration, it is also preferable, after having switched the IGBT domain(s) back to the on-state, to apply the negative voltage to the trench gate electrode(s) of the reverse conducting semiconductor device(s) to which the return current is flowing. This is a useful teaching that is independent of whether or not the negative voltage is applied to the trench gate electrode(s) of the reverse conducting semiconductor device(s) upon the flowing of the return current. Naturally in the case of applying the negative voltage to the trench gate electrode(s) of the reverse conducting semiconductor device(s) upon the flowing of the return current, it is required, prior to switching the IGBT domain(s) back to the on-state, to stop the application of the negative voltage to the trench gate electrode(s) of the reverse conducting semiconductor device(s) of, upon flowing of the return current, which had caused the flow of the return current as a result of the device(s) being in the off-state.

The driving method in this case may be a driving method in which, upon supplying power by switching at least two IGBT domains among a plurality of reverse conducting semiconductor devices that configure the power supply device to the on-state by applying the positive voltage to the trench gate electrodes of the two reverse conducting semiconductor devices, and by switching one of the two IGBT domains to the off-state and maintaining the other of the IGBT domains in the on-state, thereby allowing the return current to flow to a diode element domain of a third reverse conducting semiconductor device(s), and applying the negative voltage to the trench gate electrode of the third reverse conducting semiconductor device(s) after having switched the other of the IGBT domain back to the on-state from the off-state.

As has been previously described, this driving method is useful regardless to whether or not the negative voltage is applied to a trench gate electrode(s) of a return diode(s) (the diode of the third reverse conducting semiconductor device(s)) to which the return current flows when the aforesaid other of the IGBT domains is switched to the off-state.

When an IGBT domain that has previously been switched to the off-state is switched back to the on-state, reverse recovery current flows to the return diode(s) to which the return current had been flowing (the diode(s) of the third reverse conducting semiconductor device(s)). When the negative voltage is applied to the trench gate electrode(s) of the return diode(s) to which reverse recovery current is flowing, an attainment of a large reverse recovery current can be inhibited. Loss that occurs during switching of the power supply device can be held to a low level.

The present teachings may be embodied in a power supply device that is configured by combining a plurality of reverse conducting semiconductor devices.

This power supply device is provided with a gate voltage control circuit that controls gate voltage applied to the gate electrode of each reverse conducting semiconductor device. Each reverse conducting semiconductor device is provided with a switching element and a return diode connected in reverse parallel to the switching element, and has characteristics of switching the switching element to the on-state when a voltage of a first polarity (e.g., a positive voltage) is applied to the gate electrode, and increasing a quantity of minority carriers in the return diode when a voltage of a second polarity (which in the case of the first polarity voltage is the positive voltage, is a negative voltage) is applied to the gate electrode. The gate electrode is not necessarily limited to being formed within a trench.

In this power supply device, a plurality of series circuits in each of which two reverse conducting semiconductor devices are connected in series are connected in parallel. This parallel circuit is connected between a pair of terminals of a power source. An intermediate electric potential point between the reverse conducting semiconductor devices in each of the plurality of series circuits is connected to a load. This power supply device is used by being connected to the power source and the load, and supplies electric power to the load.

In this power supply device, the gate voltage control circuit controls the gate voltage applied to each gate electrode under the following conditions:

(1) applying the first polarity voltage to the gate electrode of one reverse conducting semiconductor device on one side of the intermediate electric potential point of one series circuit (and thus, the switching element of this reverse conducting semiconductor device is turned on);

(2) not applying the first polarity voltage to the gate electrode of another reverse conducting semiconductor device on another side of the intermediate electric potential point of the series circuit of (1) above (and thus, the switching element of another reverse conducting semiconductor device present on another side in the same series circuit as the reverse conducting semiconductor device that has been switched on in (1) above is turned off);

(3) not applying the first polarity voltage to the gate electrode of one reverse conducting semiconductor device on one side of the intermediate electric potential point of at least one of the other series circuits (and thus, the switching element of the reverse conducting semiconductor device present on one side in the other series circuit as the reverse conducting semiconductor device that has been switched on in (1) above is turned off); and, (4) applying the first polarity voltage to the gate electrode of another reverse conducting semiconductor device of the intermediate electric potential point of the series circuit of (3) above (and thus, the switching element of the reverse conducting semiconductor device present on another side in the other series circuit as the reverse conducting semiconductor device switched on in (1) above is turned on).

In this case, the reverse conducting semiconductor device on one side of the one series circuit is switched on in (1) above, the reverse conducting semiconductor device on another side of the other series circuit is switched on in (4) above, and electric power is supplied from the power source to the load by these reverse conducting semiconductor devices.

(5) In this case, a direction in which power is supplied to the load is sequentially switched by sequentially changing the series circuit to which the first polarity voltage is to be applied to the gate electrode in (1) above (and thus, the series circuit by which the first polarity voltage is applied to the gate electrode in (4) above is also sequentially switched).

(6) In the power supply device of the present teachings, the second polarity voltage is applied to the gate electrode of (2) above upon stopping application of the first polarity voltage to the gate electrode to which the first polarity voltage has been applied in (1) above.

In the present device, the application of the first polarity voltage to the gate electrode to which the first polarity voltage has been applied in (1) above is stopped in order to switch the direction of power supply or to adjust supplied RMS current. At this time, the first polarity voltage continues to be applied to the gate electrode to which the first polarity voltage has been applied in (4) above. Whereupon, the return current flows to the diode element domain of the reverse conducting semiconductor device in the off-state as explained in (2) above (namely, the reverse conducting semiconductor device present on another side in the same series circuit as the reverse conducting semiconductor device that switched on and off). In the power supply device of the present device, the second polarity voltage is applied to the gate electrode when the return current flows to the diode element domain of the reverse conducting semiconductor device of (2) above. Consequently, minority carrier density of a site facing the gate domain, i.e. a low impurity concentration region of the return diode to which the return current flows increases, and an inversion layer is formed. As a result, the forward voltage drop of the return diode is reduced. The constant loss attributable to the return diode can be reduced.

In (6) above, the second polarity voltage may be applied to the gate electrode of (2) above by synchronizing with a timing at which the application of the first polarity voltage to the gate electrode of (1) above is stopped.

The gate voltage control circuit determines the timing at which application of the first polarity voltage to the gate electrode of (1) above is stopped in (6) above based on the timing at which the direction in which current is supplied is switched. Alternatively, the gate voltage control circuit determines the timing at which the application of the first polarity voltage to the gate electrode of (1) above is stopped in (6) above based on the actual magnitude of the RMS current.

if application of the second polarity voltage to the gate electrode of (2) above is made to be applied synchronously with the timing determined by the gate voltage control circuit, the inversion layer can be formed in the return diode when the return current flows to the return diode. The forward voltage drop of the return diode can be reduced, and the constant loss attributable to the return diode can also be reduced.

As an alternative to those described above, an amount of current that flows to the reverse conducting semiconductor device of (2) above may be measured, and the second polarity voltage may be applied to the gate electrode of (2) above by synchronizing with the timing at which the return current begins to flow to the reverse conducting semiconductor device of (2) above.

According to this method as well, the inversion layer can be formed in the return diode when return current flows to the return diode. The forward voltage drop of the return diode can be reduced, and the constant loss attributable to the return diode can also be reduced.

Application of the second polarity voltage to the gate electrode of (2) above is preferably stopped prior to a timing at which the first polarity voltage is again applied to the gate electrode of (1) above for which the previous application of the first polarity voltage had been stopped in (6) above.

In this case, the reverse recovery current flowing to the return diode can be held to a low level.

Apart from whether or not the second polarity voltage is applied to the gate electrode of the return diode when the return current flows to the return diode, the application of the second polarity voltage to the gate electrode of the return diode upon the reverse recovery current flowing thereto is useful.

In other words:

(7) in the case whereupon the application of the first polarity voltage to the gate electrode to which the first polarity voltage has been applied in (1) is to be stopped, the first polarity voltage is kept applied to the gate electrode of (4) above so that the return current flows to the return diode of the reverse conducting semiconductor device of (2) above, (8) subsequent to the timing at which the first polarity voltage is applied again to the gate electrode for which the application of the first polarity voltage had been stopped in (7) above, the second polarity voltage is preferably applied to the gate electrode of the reverse conducting semiconductor device to which return current has been flowing in (7) above.

According to the power supply device described above, in the case of the reverse recovery current flowing to the return diode, said reverse recovery current can be held to a low level.

The switching element and the return diode may be independent elements. Namely, a composition circuit may be configured by a switching element and a diode connected in reverse to the switching element. The diode in this case is required to have a polarity that increases the quantity of minority carriers corresponding to the applied voltage. The electrode is not necessarily limited to a gate electrode, and may be an independent electrode from the gate electrode of the switching element.

The power supply device in this case is provided with a plurality of composition circuits in each of which a switching element and a return diode having an electrode configured to increase a quantity of minority carriers corresponding to an applied voltage are connected in reverse parallel, a switch circuit that switches a state of each switching element between an on-state and an off-state, and a voltage control circuit that controls a voltage applied to the electrode of each return diode, and supplies electric power to a load by connecting to a power source and the load.

In this power supply device, a plurality of series circuits, in each of which a plurality of composition circuits are connected in series, are connected in parallel. This parallel circuit is connected between a pair of terminals of the power source, and an intermediate electric potential point between of each series circuit is connected to a load.

The switch circuit switches the state of each switching element under the following conditions:

(1) switch the switching element on one side of the intermediate electric potential point of one series circuit to the on-state, (2) switch the switching element on another side of the intermediate electric potential point of the series circuit of (1) above to the off-state, (3) switch the switching element on one side of the intermediate electric potential point of at least one of other series circuit to the off-state, and (4) adjust the direction in which the current is supplied to the load and the magnitude of the RMS current supplied by switching the switching element on another side of the intermediate electric potential point of the series circuit of (3) above to the on-state.

(5) In this power supply device, the direction in which power is supplied to the load is sequentially switched by sequentially changing the series circuit in which the switching element on one side is to be switched to the on-state in (1) above. In this power supply device:

(6) when the switching element having been switched to the on-state in (1) above is switched to the off-state, the voltage control circuit applies a voltage of a polarity that increases a quantity of minority carriers to the electrode of the return diode connected in reverse parallel to the switching element of (2) above.

Here, if a plurality of composition circuits are formed on one side or another side of the intermediate electric potential point of a series circuit, the on-state refers to the state in which all switching elements of the composition circuits formed on said one side or another side of the intermediate electric potential point of the series circuit are switched to the on-state. In addition, the off-state refers to the state in which at least one of the switching elements of the composition circuits formed on said one side or another side of the intermediate electric potential point of the series circuit is switched to the off-state.

According to this power supply device, the forward voltage drop that occurs when the return current flows to the return diode can be reduced. The constant loss attributable to the return diode can also be reduced.

Application of the voltage of the polarity that increases the quantity of the minority carriers to the electrode of the return diode connected in reverse parallel to the switching element of (2) above is preferably stopped prior to a timing at which the switching element that was switched to the off-state in (6) above is switched back to the on-state.

In this case, when the reverse recovery current flows to the return diode, the reverse recovery current can be inhibited from reaching a large magnitude. The switching loss attributable to the return diode can be reduced.

In the power supply device of the present teachings:

(7) in switching the switching element having been switched to the on-state in (1) above to the off-state, the switching element of (4) above is maintained in the on-state so that the return current flows to the return diode connected in reverse parallel to the switching element of (2) above.

Further, subsequent to the timing at which the switching element having been switched to the off-state in (7) above is switched back to the on-state, the voltage control circuit preferably applies the voltage of the polarity that increases the quantity of the minority carriers of the return diode to the electrode of the return diode to which return current has flown in (7) above.

In this case, when the reverse recovery current flows to the return diode, the reverse recovery current can be inhibited from reaching a large magnitude. The switching loss attributable to the return diode can be reduced.

As has been described above, according to the present teachings, the characteristics of the return diode can be actively controlled. When the return current flows to the return diode, the forward voltage drop can be lowered and the constant loss can be reduced by increasing the quantity of minority carriers and switching to a state that facilitates the flow of the return current. In addition, when the reverse recovery current flows to the return diode, increase in the reverse recovery current can be inhibited by either preliminarily reducing the quantity of the minority carriers that increase the reverse recovery current, or by inhibiting the migration of the minority carriers that otherwise would increase the reverse recovery current if no restrictions are placed on the minority carriers. Electric power loss attributable to the reverse recovery operation can be reduced.

Wasteful consumption of electric power by the power supply device can be reduced by adjusting the quantity of the minority carriers according to the state of the return diode.

DETAILED DESCRIPTION OF THE INVENTION

Preferred Features of an Embodiment of the Invention

Some of the features of the below-described embodiment will be listed.

(Feature 1) The power supply device that is driven by the driving method of the present teachings is an inverter circuit.

(Feature 2) The power supply of the present teachings is provided with a plurality of reverse conducting semiconductor devices. The each of reverse conducting semiconductor devices is provided with an IGBT domain provided with a trench gate electrode, and a diode element domain provided with a trench gate electrode. The trench gate electrode of the IGBT domain and the trench gate electrode of the diode element domain are connected to the same gate voltage control circuit and are adjusted to the same electric potential.

(Feature 3) At least one of an emitter electrode and a collector electrode of the reverse conducting semiconductor devices are divided into two electrodes, and one of the divided electrodes is connected to a current measurement circuit.

Figure 1A:
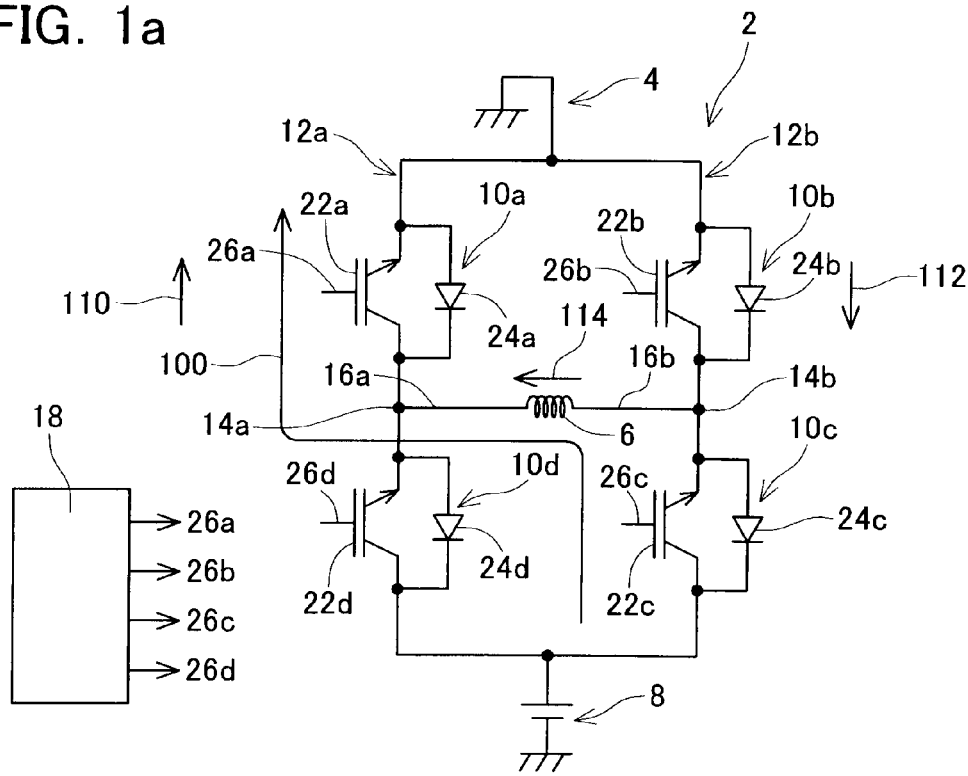
FIG. 1A shows a circuit diagram of a power supply device 2.

FIG. 1A shows a power supply device 2 that embodies the present teachings. Letters of the alphabet are used in connection with the reference numbers, and in a case where the alphabets are omitted in the subsequent explanation, this indicates that the explanation applies similarly to members having the same reference number.

An insulated gate bipolar transistor (IGBT) domain 22 and a return diode 24 are integrally formed in a reverse conducting semiconductor device 10.

Figure 3A:
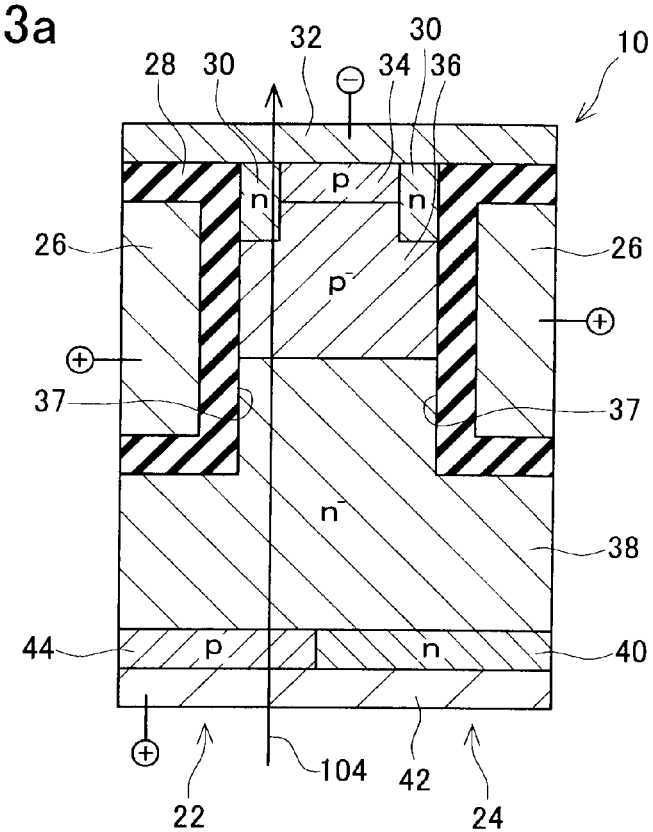
FIG. 3A shows a longitudinal cross-sectional structure of a reverse conducting semiconductor device 10.

FIG. 3A shows a portion of a cross-sectional structure of the reverse conducting semiconductor device 10. The reverse conducting semiconductor device 10 is formed in a single semiconductor substrate containing n-type impurities at a low concentration, in which a drift region 38 is formed by a portion thereof that is left unprocessed. A body region 36 containing p-type impurities at a low concentration is stacked on the top side of the drift region 38. Emitter regions 30 containing the n-type impurities at a high concentration are formed at locations that face the surface of the body region 36. Each emitter region 30 is separated from the drift region 38 by the body region 36. A body contact region 34 containing the p-type impurities at a high concentration is formed at a location that faces the surface of the body region 36 within a range that is located between a pair of emitter regions 30. The body contact region 34 is conductively in contact with the body region 36.

Trenches 37 are formed extending from the surface of each emitter region 30 to the drift region 38 by penetrating through the emitter regions 30 and the body region 36. The wall surface of each trench 37 is coated with a gate insulating film 28, and a trench gate electrode 26 is filled in each trench 37. The upper surfaces of the trench gate electrodes 26 are coated with the gate insulating films 28. An emitter electrode 32 is formed on the surface of the reverse conducting semiconductor device 10. The emitter electrode 32 is conductively in contact with the emitter regions 30 and the body contact region 34. The trench gate electrodes 26 are exposed on the surface of the reverse conducting semiconductor device 10 in a cross-section not shown in the drawings, and are connected to a gate voltage control circuit 18 (see FIG. 1).

A collector region 44 containing p-type impurities at a high concentration and a drift contact region 40 containing n-type impurities at a high concentration are formed on the back side of the reverse conducting semiconductor device 10. The drift contact region 40 is in continuity with the drift region 38. A collector electrode 42 is formed on the back side of the reverse conducting semiconductor device 10. The collector electrode 42 is in conductively in contact with the collector region 44 and the drift contact region 40.

In the domain 22 in which the collector electrode 42 is formed, the reverse conducting semiconductor device 10 functions as an IGBT. In the domain 22 functioning as the IGBT, the n-type emitter regions 30, the p-type body region 36, the n-type drift region 38 and the p-type collector region 44 are stack-layered, and the trench gate electrodes 26 are formed extending through the body region 36 that separates the emitter regions 30 and the drift region 38.

When a positive voltage is applied to the trench gate electrodes 26 in a state in which the positive voltage is applied to the collector electrode 42 and the emitter electrode 32 is grounded, current flows between the collector region 44 and the emitter regions 30. This state is referred to as an "on-state". When application of the positive voltage to the trench gate electrodes 26 is stopped, the current no longer flows between the collector region 44 and the emitter regions 30. This state is referred to as an "off-state". The IGBT domain 22 is switched to the on-state when the positive voltage is applied to the trench gate electrodes 26, and is switched to the off-state when application of the positive voltage to the trench gate electrodes 26 is stopped.

In the domain 24 in which the drift contact region 40 is formed, the reverse conducting semiconductor device 10 functions as a return diode. In the domain 24 functioning as the return diode, the p-type body contact region 34, the p-type body region 36, the n-type drift region 38 and the n-type drift contact region 40 are stack-layered, and the trench gate electrodes 26 are formed from the surface to the body region 36.

When a positive voltage higher than the positive voltage of the collector electrode 42 is applied to the emitter electrode 32, a diode is formed in which the p-type body contact region 34 functions as an anode and the n-type drift contact region 40 functions as a cathode. A PIN-type diode, in which a region having a low impurity concentration is formed, is formed between the p-type anode and the n-type cathode.

Forward current flows to the PIN-type diode 24 when a positive voltage higher than the positive voltage of the collector electrode 42 is applied to the emitter electrode 32 of the PIN-type diode 24. Although a forward voltage drop of the PIN-type diode 24 can be reduced if the impurity concentrations of the body region 36 and the drift region 38, which constitute I-type regions having low concentrations of impurities, are increased, when the impurity concentrations of the body region 36 and the drift region 38 are increased, the withstand voltage performance of the reverse conducting semiconductor device 10 as a result decreases. The impurity concentrations of the body region 36 and the drift region 38 cannot be raised in order to ensure a required level of breakdown voltage performance, the forward voltage drop of the PIN-type diode 24 as a result becomes large. In the present embodiment, the forward voltage drop of the PIN-type diode 24 is reduced by using the trench gate electrodes 26 present in the PIN-type diode 24.

Figure 3B:
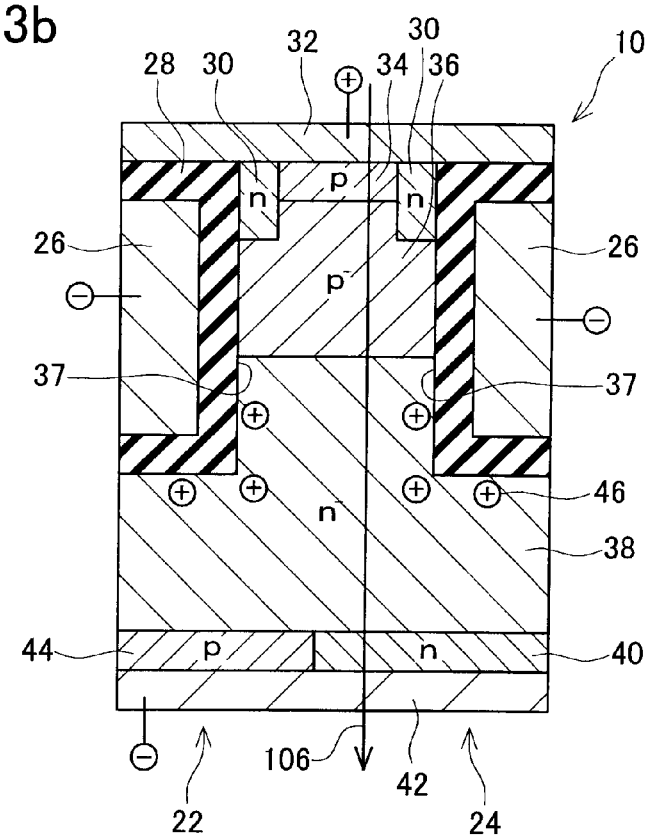
FIG. 3B shows a longitudinal cross-sectional structure of the reverse conducting semiconductor device 10.

FIG. 3B shows a case in which the positive voltage higher than the positive voltage of the collector electrode 42 is applied to the emitter electrode 32, and forward current 106 flows to the return diode 24. This indicates a case in which a negative voltage is applied to the trench gate electrodes 26. When the negative voltage is applied to the trench gate electrodes 26, the p-type carriers 46 are generated in the n-type drift region 38 over a range that faces the trench gate electrodes 26, and inversion layers are formed along the trench gate electrodes 26. The quantity of the minority carriers within the n-type drift region 38 increases when the negative voltage is applied to the trench gate electrodes 26. When the inversion layers are formed along the trench gate electrodes 26, the quantity of carriers that move from the body region 36 to the drift region 38 can be increased when current is applied to the return diode 24. As a result, the forward voltage drop of the return diode 24 can be lowered. The constant loss during when the current is applied to the return diode 24 can be inhibited.

The reverse recovery current flows to the return diode 24 when the voltage of the collector electrode 42 is returned to a state higher than the voltage of the emitter electrode 32. At this time, the reverse recovery current ends up increasing as a result of holes concentrated over the range that faces the trench gate electrodes 26 returning to the body region 36 when the voltage of the collector electrode 42 returns to a state higher than the voltage of the emitter electrode 32 while a negative voltage is applied to the trench gate electrodes 26.

Figure 4:
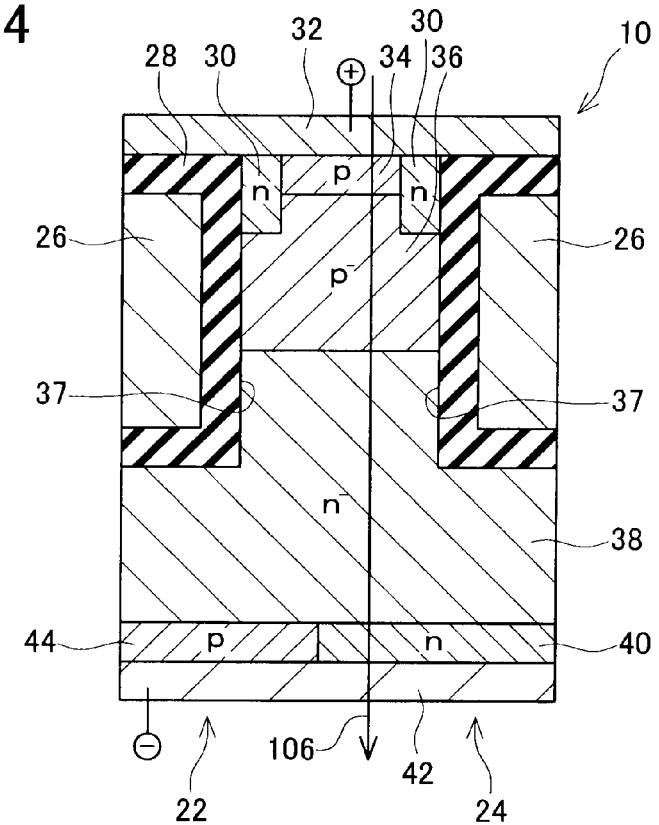
FIG. 4 shows a longitudinal cross-sectional structure of the reverse conducting semiconductor device 10.

When application of the negative voltage to the trench gate electrodes 26 is stopped prior to the timing at which the voltage of the collector electrode 42 returns to a state higher than the voltage of the emitter electrode 32, as shown in FIG. 4, the state can be returned to a state in which the quantity of minority carriers within the drift region 38 is not increased, and the reverse recovery current can begin to flow once this state has been reached. This being the case, the magnitude of the reverse recovery current that flows when the voltage of the collector electrode 42 has returned to the state higher than the voltage of the emitter electrode 32 can be reduced. If the application of the negative voltage to the trench gate electrodes 26 is stopped prior to the timing at which the voltage of the collector electrode 42 returns to the state higher than the voltage of the emitter electrode 32, in addition to the reverse recovery loss being able to be inhibited, the return diode can be prevented from being destroyed by the flow of excessive reverse recovery current.

Figure 5:
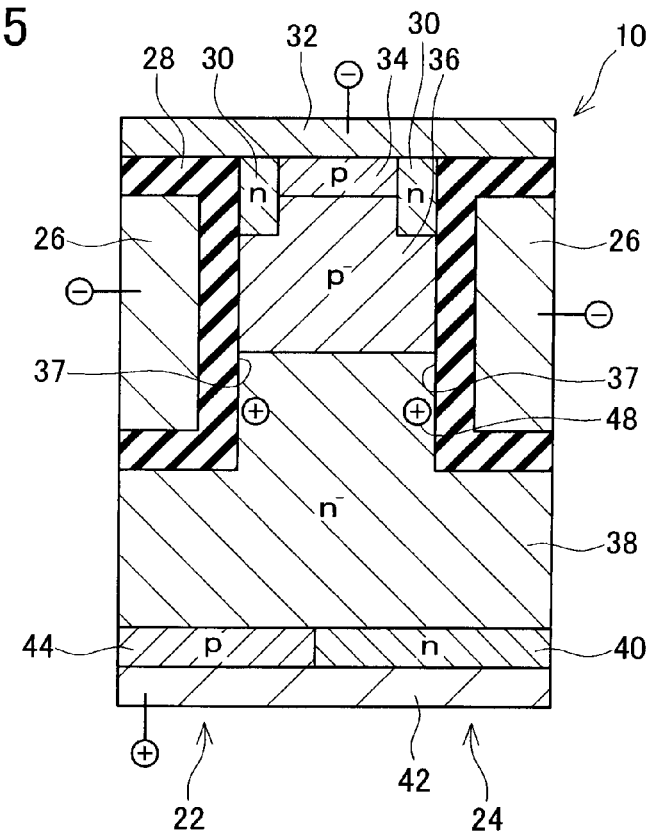
FIG. 5 shows a longitudinal cross-sectional structure of the reverse conducting semiconductor device 10.

The reverse recovery current flows to the return diode 24 when the voltage of the collector electrode 42 returns to the state higher than the voltage of the emitter electrode 32 while the return current is flowing from the emitter electrode 32 to the collector electrode 42. When the reverse recovery current begins to flow and the negative voltage is applied to the trench gate electrodes 26, the reverse recovery current can be inhibited from developing into a large reverse recovery current. The reverse recovery current flows as a result of the p-type carriers (minority carriers) injected into the n-type drift region 38 moving to the body region 36. If a negative voltage is applied to the trench gate electrodes 26 at the timing at which the reverse recovery current flows, the p-type carriers 48 are attracted to the drift region 38 over the range that faces the trench gate electrodes 26 as shown in FIG. 5. As a result, the speed at which the p-type carriers 48 return to the body region 36 is decreased, and the attainment of large reverse recovery current can be inhibited.

If an attainment of the large reverse recovery current can be inhibited by utilizing the phenomenon explained with reference to FIG. 4 or FIG. 5, the rate at which the reverse recovery current changes can be reduced, and a surge voltage generated due to the rate of change in current can be held to a low level. The IGBT domain 22 can also be prevented from being destructed by this surge voltage.

As shown in FIG. 1, the power supply device 2 is provided with a series circuit 12a, in which reverse conducting semiconductor devices 10a and 10d are connected in series, and a series circuit 12b, in which reverse conducting semiconductor devices 10b and 10c are connected in series. The series circuit 12a and the series circuit 12b are connected in parallel. The collector electrodes 42 of the reverse conducting semiconductor devices 10c and 10d are connected to a direct current power source 8. The emitter electrodes 32 of the reverse conducting semiconductor devices 10a and 10b are grounded. The emitter electrode 32 of the reverse conducting semiconductor device 10d is connected to the collector electrode 42 of the reverse conducting semiconductor device 10a. The emitter electrode 32 of the reverse conducting semiconductor device 10c is connected to the collector electrode 42 of the reverse conducting semiconductor device 10b.

An intermediate electric potential point 14a of the series circuit 12a is connected to one terminal of a motor coil 6 via an output wire 16a. An intermediate electric potential point 14b of the series circuit 12b is connected to another terminal of the motor coil 6 via an output wire 16b. The motor coil 6 is an electrical load that contains a reactance component.

Each trench gate electrode 26a, 26b, 26c and 26d of the reverse conducting semiconductor devices 10a, 10b, 10c and 10d is connected to the gate voltage control circuit 18. The gate voltage control circuit 18 independently controls the voltages of the trench gate electrodes 26a, 26b, 26c and 26d.

In the present teachings, the power supply device 2 controls the electric power supplied to the motor coil 6 by changing the voltages applied to the trench gate electrodes 26a, 26b, 26c and 26d of the reverse conducting semiconductor devices 10a, 10b, 10c and 10d at fixed time intervals. The timing chart of FIG. 2 depicts changes of the voltages applied to the trench gate electrodes 26a, 26b, 26c and 26d of the reverse conducting semiconductor devices 10a, 10b, 10c and 10d.

Figure 2:
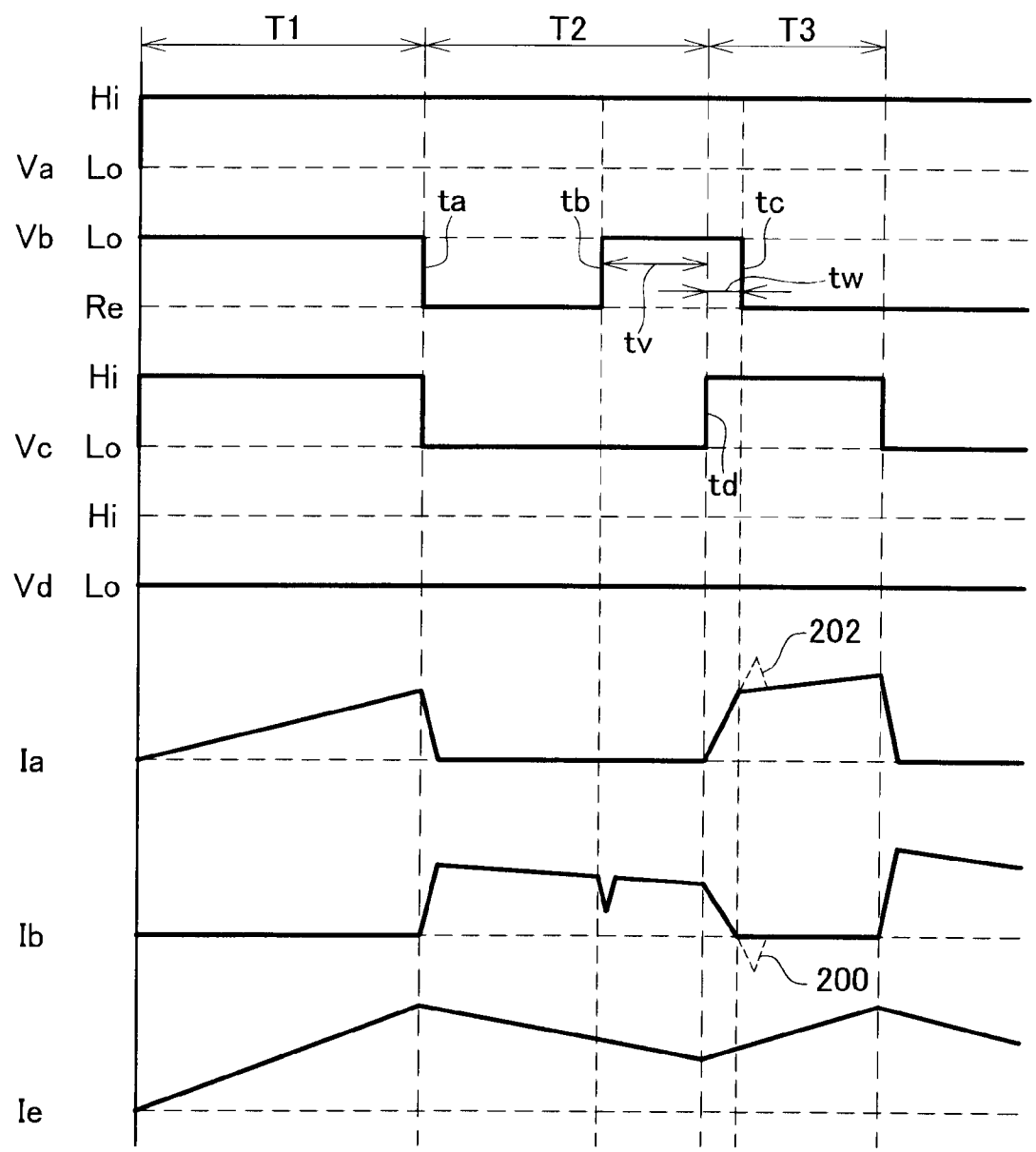
FIG. 2 shows a timing chart.

Va in FIG. 2 indicates the voltage applied to the trench gate electrodes 26a of the reverse conducting semiconductor device 10a. Vb in FIG. 2 indicates the voltage applied to the trench gate electrodes 26b of the reverse conducting semiconductor device 10b. Vc in FIG. 2 indicates the voltage applied to the trench gate electrodes 26c of the reverse conducting semiconductor device 10c. Vd in FIG. 2 indicates the voltage applied to the trench gate electrodes 26d of the reverse conducting semiconductor device 10d. Hi indicates a positive voltage greater than or equal to a threshold voltage of IGBT domains 22a, 22b, 22c and 22d of the reverse conducting semiconductor devices 10a, 10b, 10c and 10d. The IGBT domains 22a, 22b, 22c and 22d become electrically conductive as a result of applying the Hi voltage. Lo indicates a voltage greater than or equal to the threshold voltage of the IGBT domains 22a, 22b, 22c and 22d of the reverse conducting semiconductor devices 10a, 10b, 10c and 10d. The IGBT domains 22a, 22b, 22c and 22d become electrically nonconductive as a result of applying the Lo voltage. In the present embodiment, the Lo voltage is a voltage of the trench gate electrode 26 when the gate voltage control circuit 18 does not apply a voltage to the trench gate electrode 26. The Lo voltage is applied to the trench gate electrode 26 when the application of the Hi voltage by the gate voltage control circuit 18 to that trench gate electrode 26 is stopped.

Re indicates a voltage of the opposite polarity of the threshold voltage of the IGBT domains 22a, 22b, 22c and 22d of the reverse conducting semiconductor devices 10a, 10b, 10c and 10d (namely, a negative voltage), and indicates a negative voltage having an absolute value that is greater than or equal to the threshold voltage. The IGBT domains 22a, 22b, 22c and 22d of the reverse conducting semiconductor devices 10a, 10b, 10c and 10d become electrically nonconductive as a result of applying the Re voltage, thereby causing a change in the quantity of the minority carriers within the return diodes 24a, 24b, 24c and 24d of the reverse conducting semiconductor devices 10a, 10b, 10c and 10d. Ia in FIG. 2 indicates an amount of current that flows in the direction indicated by an arrow 110 in FIG. 1 in the reverse conducting semiconductor device 10a. Ib in FIG. 2 indicates an amount of current that flows in the direction indicated by an arrow 112 in FIG. 1 in the reverse conducting semiconductor device 10b. Ie in FIG. 2 indicates an amount of current that flows in the direction of an arrow 114 in FIG. 1 to the motor coil 6.

FIG. 2 illustrates a state in which the IGBT domain 22a of the reverse conducting semiconductor device 10a is constantly in the on-state, and the IGBT domain 22c of the reverse conducting semiconductor device 10c is switched between the on-state and the off-state. The current flows to the motor coil 6 in the direction indicated by the arrow 114 by switching the reverse conducting semiconductor devices 10a and 10c to the on-state. The RMS current magnitude that flows to the motor coil 6 can be adjusted by switching the IGBT domain 22c of the reverse conducting semiconductor device 10c between the on-state and the off-state. The RMS current magnitude is adjusted to a larger value if the duration in which the IGBT domain 22c of the reverse conducting semiconductor device 10c is in the on-state is lengthened, and the duration in which it is in the off-state is shortened. The RMS current magnitude is adjusted to a smaller value if the duration in which the IGBT domain 22c of the reverse conducting semiconductor device 10c is in the on-state is shortened, and the duration in which it is in the off-state is lengthened. The RMS current magnitude can also be adjusted by maintaining the IGBT domain 22c of the reverse conducting semiconductor device 10c in the on-state and switching the IGBT domain 22a of the reverse conducting semiconductor device 10a between the on-state and the off-state.

Although not shown in FIG. 2, a state also exists in which the IGBT domain 22b of the reverse conducting semiconductor device 10b is constantly in the on-state and the IGBT domain 22d of the reverse conducting semiconductor device 10d is switched between the on-state and the off-state. The current flows to the motor coil 6 in the opposite direction indicated by the arrow 114 by switching the reverse conducting semiconductor devices 10b and 10d to the on-state. The RMS current magnitude is adjusted to a larger value if the duration in which the IGBT domain 22d of the reverse conducting semiconductor device 10d is in the on-state is lengthened, and the duration in which it is in the off-state is shortened. The RMS current magnitude is adjusted to a smaller value if the duration in which the IGBT domain 22d of the reverse conducting semiconductor device 10d is in the on-state is shortened, and the duration in which it is in the off-state is lengthened. The RMS current magnitude can also be adjusted by maintaining the IGBT domain 22d of the reverse conducting semiconductor device 10d in the on-state and switching the IGBT domain 22b of the reverse conducting semiconductor device 10b between the on-state and the off-state.

In a first step indicated by T1 in FIG. 2, as shown in FIG. 1A, the reverse conducting semiconductor device 10a on one side of the series circuit 12a (in this case, the low voltage side) is switched to the on-state, the reverse conducting semiconductor device 10d on another side of the series circuit 12b (in this case, the high voltage side) is switched to the off-state, the reverse conducting semiconductor 10b on one side of the series circuit 12b (i.e., the low voltage side) is switched to the off-state, and the reverse conducting semiconductor device 10c on another side of the series circuit 12b (i.e., the high voltage side) is switched to the on-state. Namely, the Hi voltage is applied to the trench gate electrodes 26a of the reverse conducting semiconductor 10a and to the trench gate electrodes 26c of the reverse conducting semiconductor device 10c. In addition, the Lo voltage is applied to the trench gate electrodes 26b of the reverse conducting semiconductor 10b and to the trench gate electrodes 26d of the reverse conducting semiconductor device 10d. As a result, the current 100 flows from the direct current power source 8 through the reverse conducting semiconductor device 10c, the motor coil 6 and the reverse conducting semiconductor device 10a. In this state, a reverse voltage is applied to the return diodes 24a, 24b, 24c and 24d of the reverse conducting semiconductor devices 10a, 10b, 10c and 10d. Thus, in the first step (the duration of T1 in FIG. 2), the current does not flow through the return diodes 24a, 24b, 24c and 24d. As shown in FIG. 3A, the current 104 flows to the IGBT domains 22a and 22c of the reverse conducting semiconductor devices 10a and 10c.

Next, when operation proceeds to a second step indicated by T2 in FIG. 2, the IGBT domain 22c of the reverse conducting semiconductor device 10c that has previously been turned on is switched off. The reverse conducting semiconductor devices 10b and 10d are maintained in the off-state.

Figure 1B:
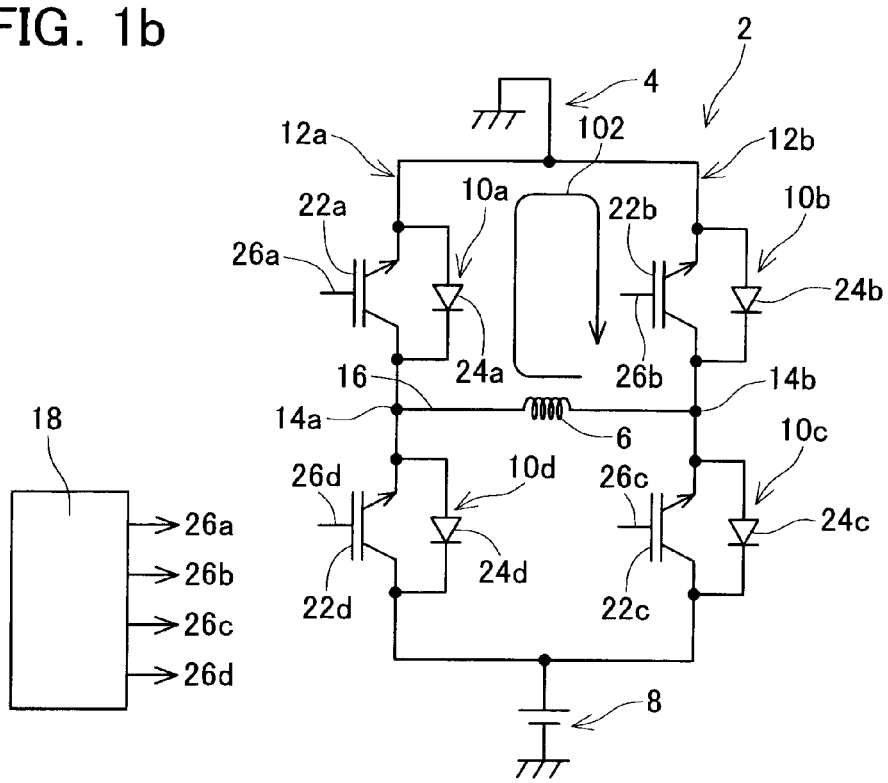
FIG. 1B shows a circuit diagram of the power supply device 2.

Since the motor coil 6 contains a reactance component, when the current 100 shown in FIG. 1A is stopped, an electromotive force is generated in the motor coil 6 that attempts to cause the return current 102 to flow in the same direction as the current 100 as shown in FIG. 1B. In the second step, the Hi voltage is applied to the reverse conducting semiconductor device 10a to which the current 100 has been flowing, and as shown in FIG. 1B, the return current 102 flows to a low electric potential side 4 through the IGBT domain 22a of the reverse conducting semiconductor device 10a. Subsequently, the return current 102 flows to the motor coil 6 through the return diode 24b of the reverse conducting semiconductor device 10b. As shown in FIG. 3B, the current 106 flows to the return diode 24b of the reverse conducting semiconductor device 10b.

On the other hand, the return current does not flow to the reverse conducting semiconductor device 10d. This is because the IGBT domain 22c of the reverse conducting semiconductor device 10c is off.

When a reverse conducting semiconductor device that has previously been on (in this case, 10c) is switched off, the return current 102 flows to a return diode 24 of the reverse conducting semiconductor device (or more precisely, the reverse conducting semiconductor device on the opposite side of an intermediate electric potential point 14, which in this case is 10b) connected in the same series circuit (in this case, 12b).

In the driving method and power supply device of the present teachings, the gate voltage control circuit 18 applies the negative voltage (Re voltage) to the reverse conducting semiconductor device 10b to which return current flows. As a result of applying the Re voltage to the reverse conducting semiconductor device 10b, the p-type carriers 46 are generated in regions facing the trench gate electrodes 26 of the drift region 38 containing a low concentration of n-type impurities as shown in FIG. 3B. As a result, an inversion layer is formed in the drift region 38 at those regions facing the trench gate electrodes 26. When the inversion layer is formed in the drift region 38, the quantity of the p-type carriers that are injected from the body region 36 into the drift region 38 can be increased. As a result, the forward voltage drop in the return diode 24b can be lowered. The constant loss attributable to the return diode 24b can be inhibited.

A timing to at which the negative voltage (Re voltage) is applied to the trench gate electrodes 26 of the reverse conducting semiconductor device 10b in the second step may be motivated by a timing at which the application of the positive voltage to the trench gate electrodes 26 of the reverse conducting semiconductor device 10c is stopped. The gate voltage control circuit 18 determines the timing at which the reverse conducting semiconductor device 10c is switched from on to off as well as from off to on, so that an adjusted RMS current is obtained. The negative voltage (Re voltage) may also be applied to the trench gate electrodes 26 of the reverse conducting semiconductor device 10b synchronous to the timing at which the application of the positive voltage to the trench gate electrodes 26 of the reverse conducting semiconductor device 10c is stopped and thereby switch the device from on to off.

Each reverse conducting semiconductor device 10a, 10b, 10c and 10d is provided with a large number of emitter regions 30, and these emitter regions 30 are divided into two parts. The emitter electrode 32 that is electrically in contact with a majority of the emitter regions 30 is connected as in the configuration in the circuit of FIG. 1. Although not shown in FIG. 1, the emitter electrode 32 that is electrically in contact with a minority of the emitter regions 30 is connected to a current measurement circuit. Since the ratio of the current that flows to the emitter regions 30 divided into two parts is known in advance, the current that flows to the emitter electrode 32 electrically in contact with the majority part of the emitter regions 30 can be calculated by measuring the current that flows to the emitter electrode 32 that is electrically in contact with the minority part of the emitter regions 30.

In this case, the time at which the return current begins to flow to the reverse conducting semiconductor device 10b may be measured, and the negative voltage (Re voltage) may be applied to the trench gate electrodes 26b of the reverse conducting semiconductor device 10b at the timing at which the return current begins to flow.

Instead of continuously applying the negative voltage (Re voltage) as applied to the reverse conducting semiconductor device 10b in the second step, the application of the negative voltage (Re voltage) to the reverse conducting semiconductor device 10b is preferably stopped before switching the temporarily switched off reverse conducting semiconductor device 10c back on. In the case of FIG. 2, the application of the negative voltage (Re voltage) to the reverse conducting semiconductor device 10b is stopped at a timing tb prior to a timing td at which the previously switched off reverse conducting semiconductor device 10c is switched back on. The time difference tv from the timing tb to the timing td is preferably determined in advance in accordance with the characteristics of the return diode of the reverse conducting semiconductor device 10.

If the voltage of the emitter electrode 32 were made to be lower than the voltage of the collector electrode 42 while applying the negative voltage (Re voltage) to the reverse conducting semiconductor device 10b, a large reverse recovery current would flow to the reverse conducting semiconductor device 10b. This is because if the collector electrode 42 was then returned to the state higher than the voltage of the emitter electrode 32 while the negative voltage is applied to the trench gate electrodes 26, holes concentrated in the range that faces the trench gate electrodes 26 return to the body region 36, thereby resulting in the large reverse recovery current.

In the present embodiment, application of the negative voltage to the trench gate electrodes 26 is stopped at a timing (namely, timing tb) before a timing (namely, timing td) at which the voltage of the collector electrode 42 returns to a state higher than the voltage of the emitter electrode 32. Consequently, as shown in FIG. 4, the state can be returned to where the quantity of minority carriers in the drift region 38 is not increased; and the reverse recovery current can be made to begin to flow from this state. Consequently, the magnitude of the reverse recovery current that flows during when the voltage of the collector electrode 42 has returned to the higher state than the voltage of the emitter electrode 32 can be held to a low level. When the application of the negative voltage to the trench gate electrodes 26 is stopped at the timing (namely, timing tb) before the timing (namely, timing td) at which the voltage of the collector electrode 42 returns to the state higher than the voltage of the emitter electrode 32, the reverse recovery loss can be inhibited, and at the same time the return diodes can be prevented from being destroyed due to the flow of excess reverse recovery current.

When the operation proceeds to a third step indicated by T3 in FIG. 2, voltages are applied to the trench gate electrodes 26a, 26b, 26c and 26d of the reverse conducting semiconductor devices 10a, 10b, 10c and 10d under the same conditions as the first step. Namely, the reverse conducting semiconductor device 10c having been temporarily switched off in T2 of the second step is switched back to on. As a result, as indicated in FIG. 1A, the current 100 flows from the direct current power source 8 through the reverse conducting semiconductor device 10c, the motor coil 6 and the reverse conducting semiconductor device 10a. Simultaneously thereto, in the reverse conducting semiconductor device 10b in which the return current flowed through the return diode 24b, reverse recovery current flows to the return diode 24b.

The reverse recovery current flows to the return diode 24 when the voltage of the collector electrode 42 returns to the state higher than the voltage of the emitter electrode 32 while the return current is flowing from the emitter electrode 32 to the collector electrode 42. When the negative voltage is applied to the trench gate electrodes 26 while the reverse recovery current begins to flow, the reverse recovery current can be inhibited from becoming a large reverse recovery current. The reverse recovery current flows as a result of the p-type carriers (minority carriers) injected into the n-type drift region moving to the body region 36. When the negative voltage is applied to the trench gate electrodes 26 at the timing at which the reverse recovery current flows (namely, the timing immediately after the timing td, namely tc in the present embodiment), the p-type carriers 48 are attracted to the drift region 38 within the range that faces the trench gate electrodes 26 as shown in FIG. 5. As a result, the rate at which the p-type carriers 48 return to the body region 36 decreases, and the reverse recovery current can be inhibited from developing into the large reverse recovery current.

If the reverse recovery current can be inhibited from becoming large by utilizing the phenomenon explained with reference to FIG. 4 or FIG. 5, the rate of change in the reverse recovery current can be reduced, and a surge voltage generated due to the rate of change in current can be held to a low level. In addition, the IGBT 22 can also be prevented from being destroyed by the surge voltage.

The following provides an explanation of the phenomenon explained with reference to FIG. 4 or FIG. 5. In the case a large number of p-type carriers have accumulated in the body region 36 during reverse recovery (which is the case of not using the phenomenon explained with reference to FIG. 4), or in the case a large number of p-type carriers migrate from the drift region 38 to the body region 36 (which is the case of not using the phenomenon explained with reference to FIG. 5), a large reverse recovery current flows as indicated with a broken line 200 in FIG. 2, and a large surge voltage is generated as indicated by broken line 202. In the present embodiment, the large surge voltage is prevented from becoming large, by preventing the reverse recovery current from becoming large, as indicated with the solid lines.

The timing tc at which the negative voltage (Re voltage) is applied to the reverse conducting semiconductor device 10b in the third step is a timing determined by measuring current Ib, and the negative voltage (Re voltage) is preferably applied at the timing when current Ib begins to flow in the opposite direction. Alternatively, a time difference tw, which is a time difference from the timing td at which the reverse conducting semiconductor device 10c is switched back to the on-state to the timing tc at which current begins to flow in the opposite direction to the reverse conducting semiconductor device 10b, may be determined in advance. The negative voltage (Re voltage) may be applied to the reverse conducting semiconductor device 10b based on that time difference tw. As a result, the Re voltage can be applied to the reverse conducting semiconductor device 10b at the timing at which the reverse recovery current begins to flow to the return diode 24b.

Figure 6:
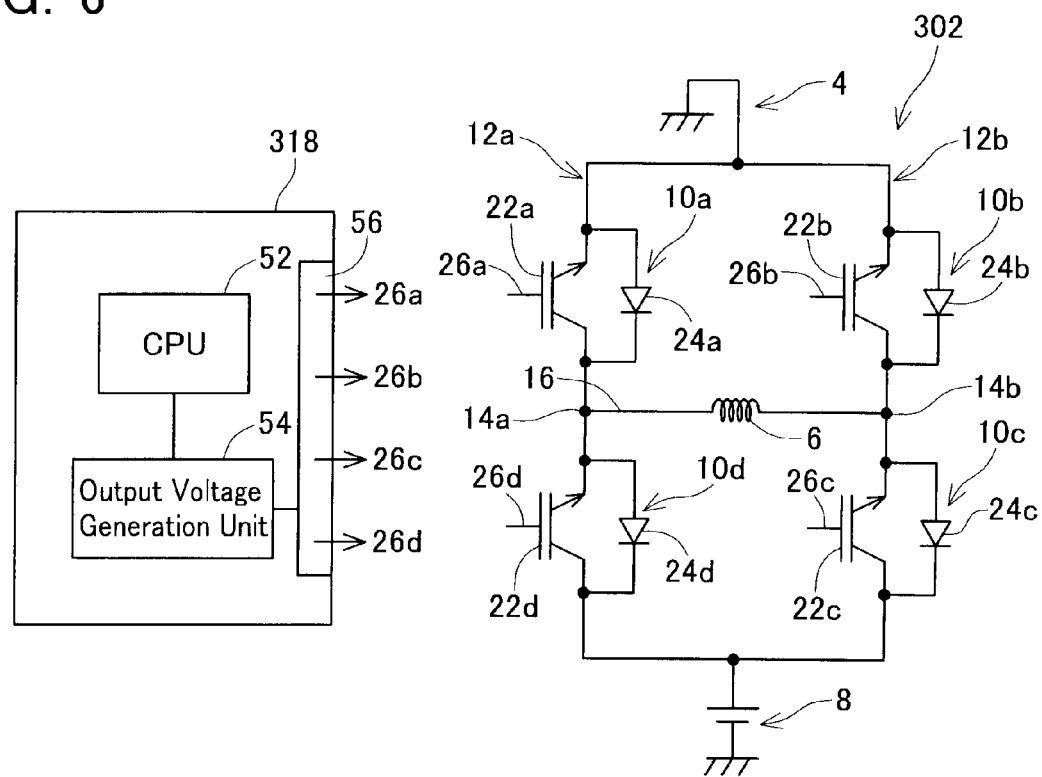
FIG. 6 shows a circuit diagram of a power supply device 302.

FIG. 6 shows a block diagram of a gate voltage control circuit 318 of the present embodiment and a power supply device 302 driven by the gate voltage control circuit 318. The power supply device 302 is one example of the power supply device 2 shown in FIG. 1. The gate voltage control circuit 318 is provided with a CPU 52, an output voltage generation unit 54, and an output port 56. The CPU 52 is connected to the output voltage generation unit 54, and the output voltage generation unit 54 is connected to all of the output wires respectively and independently through the output port 56. The output wires from the output port 56 are connected to the trench gate electrodes 26a, 26b, 26c and 26d of the reverse conducting semiconductor devices 10a, 10b, 10c and 10d.

A program for driving the power supply device 2 in accordance with the timing chart shown in FIG. 2 is preliminarily stored in a prescribed region of the CPU 52. At the start of driving, the CPU 52 reads out this program and starts driving operation, and measures an elapsed time from the start of driving. Once the driving has started, the CPU 52 applies voltages to the trench gate electrodes 26a, 26b, 26c and 26d through the output voltage generation unit 54 in accordance with the elapsed time from the start of driving. Electric power loss attributable to the driving method of the present teachings can be inhibited by applying the Hi voltage, the Lo voltage or the Re voltage to the trench gate electrodes 26a, 26b, 26c or 26d in accordance with the timing chart shown in FIG. 2.

The gate voltage control circuit 18 of the present teachings is preferably further provided with an input port.

Figure 7:
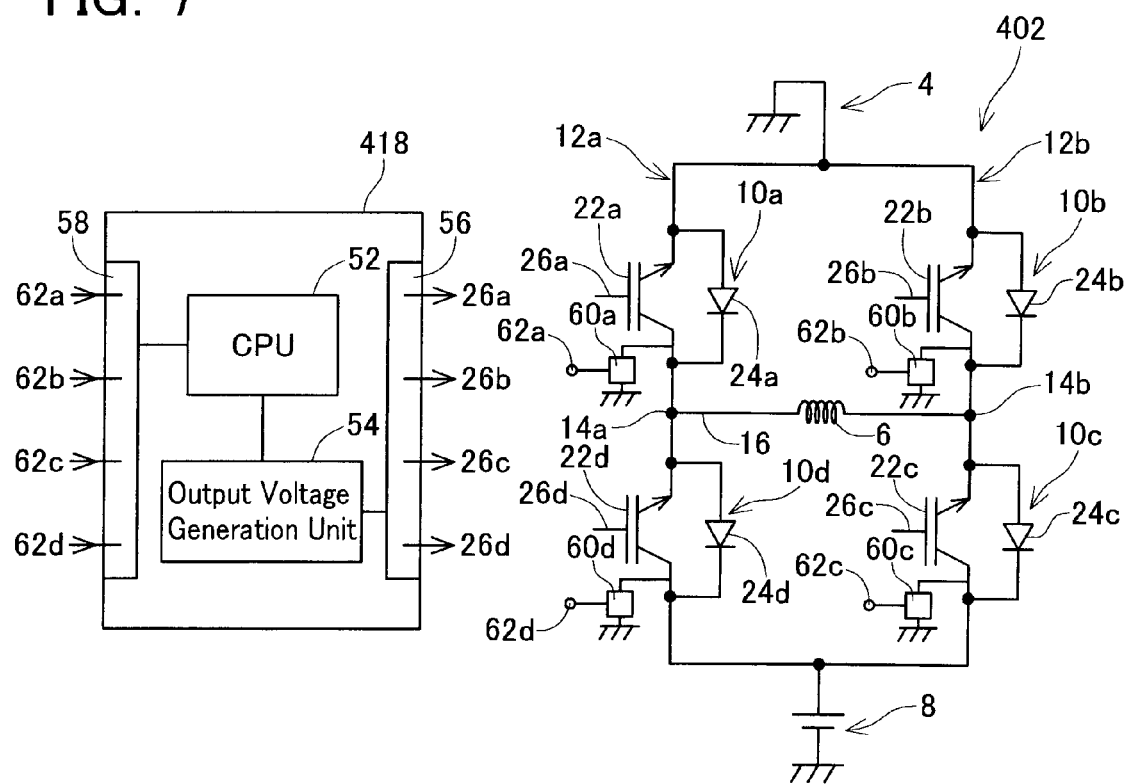
FIG. 7 shows a circuit diagram of a power supply device 402.
Figure 8A:
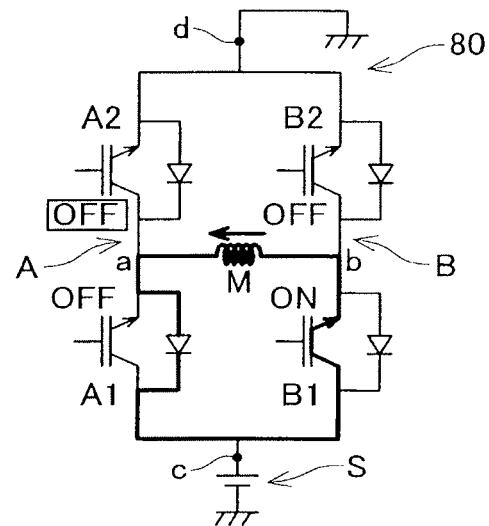
FIG. 8A shows an example of a single-phase power supply in which power is supplied to a motor M using a power supply device 80.
Figure 8B:
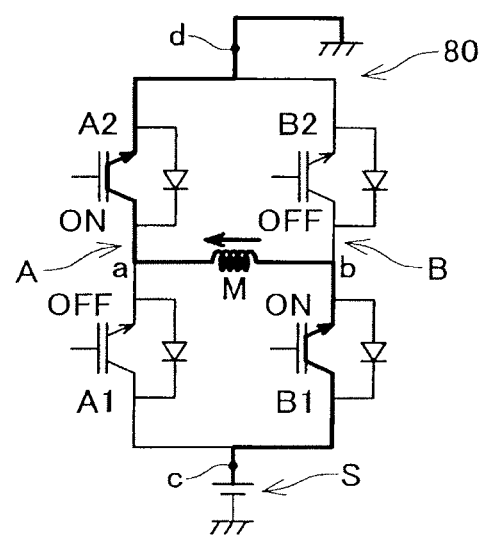
FIG. 8B shows the example of the single-phase power supply in which power is supplied to the motor M using the power supply device 80.
Figure 8C:
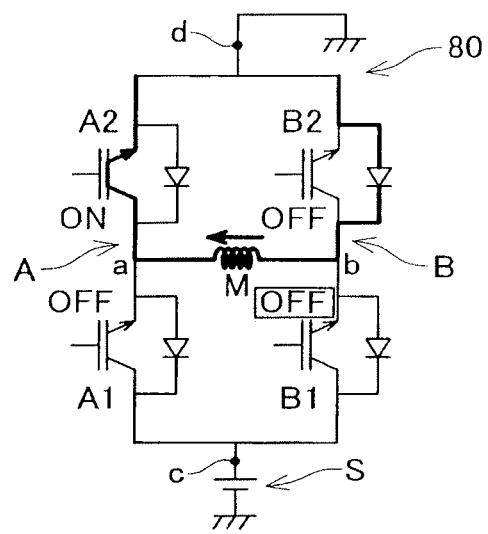
FIG. 8C shows the example of the single-phase power supply in which power is supplied to the motor M using the power supply device 80.
Figure 8D:
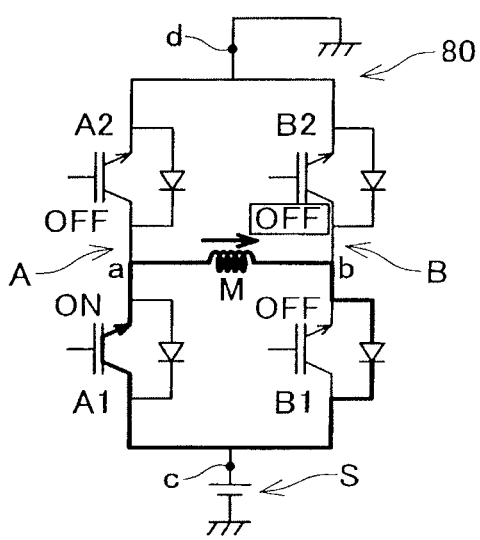
FIG. 8D shows the example of the single-phase power supply in which power is supplied to the motor M using the power supply device 80.
Figure 8E:
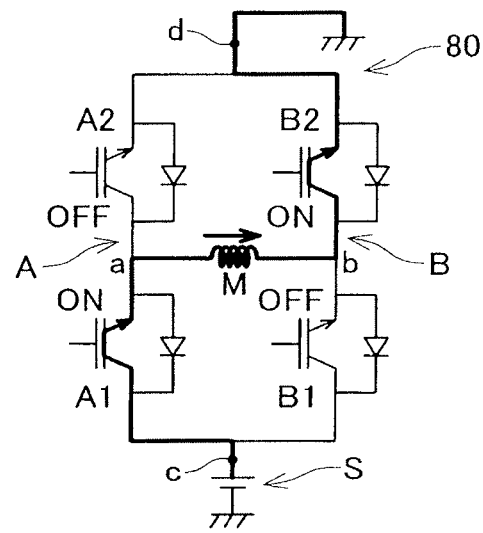
FIG. 8E shows the example of the single-phase power supply in which power is supplied to the motor M using the power supply device 80.
Figure 8F:
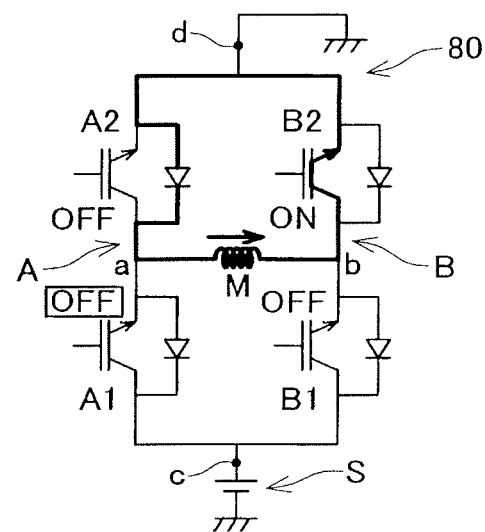
FIG. 8F shows the example of the single-phase power supply in which power is supplied to the motor M using the power supply device 80.
Figure 9A:
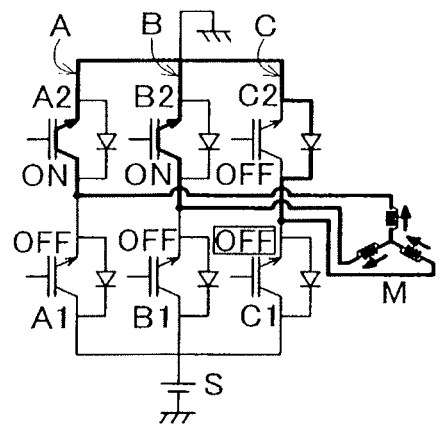
FIG. 9A shows an example of a three-phase power supply in which power is supplied to a motor M using a power supply device 80.
Figure 9B:
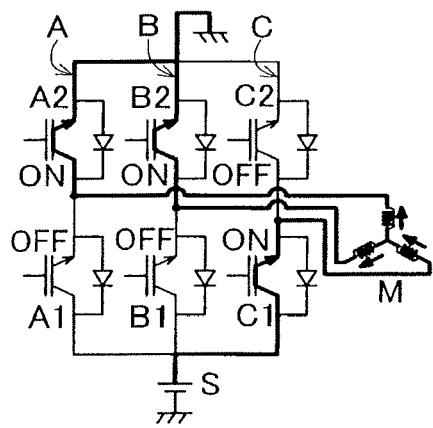
FIG. 9B shows the example of the three-phase power supply in which power is supplied to the motor M using the power supply device 80.
Figure 9C:
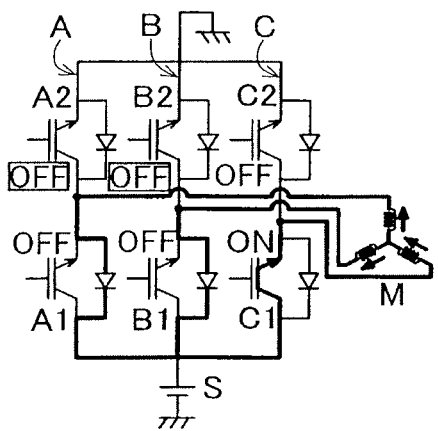
FIG. 9C shows the example of the three-phase power supply in which power is supplied to the motor M using the power supply device 80.
Figure 9D:
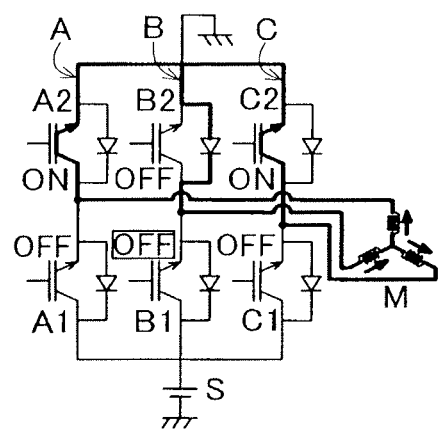
FIG. 9D shows the example of the three-phase power supply in which power is supplied to the motor M using the power supply device 80.
Figure 9E:
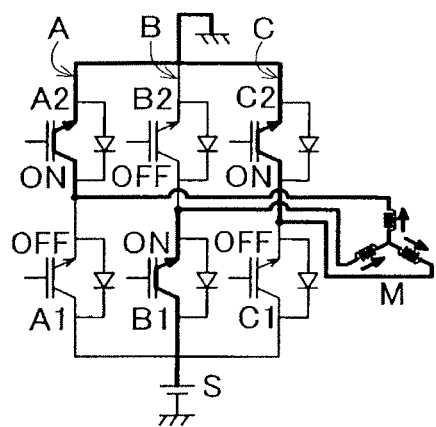
FIG. 9E shows the example of the three-phase power supply in which power is supplied to the motor M using the power supply device 80.
Figure 9F:
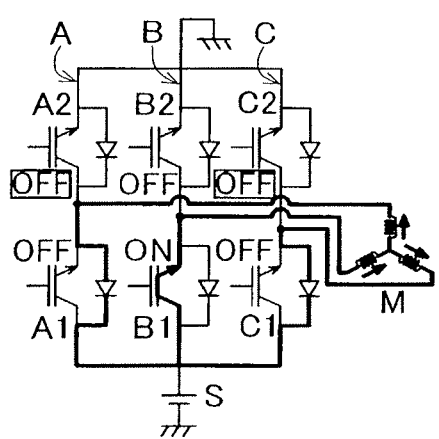
FIG. 9F shows the example of the three-phase power supply in which power is supplied to the motor M using the power supply device 80.
Figure 9G:
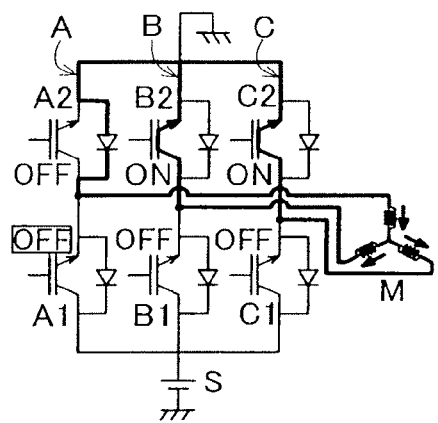
FIG. 9G shows the example of the three-phase power supply in which power is supplied to the motor M using the power supply device 80.
Figure 9H:
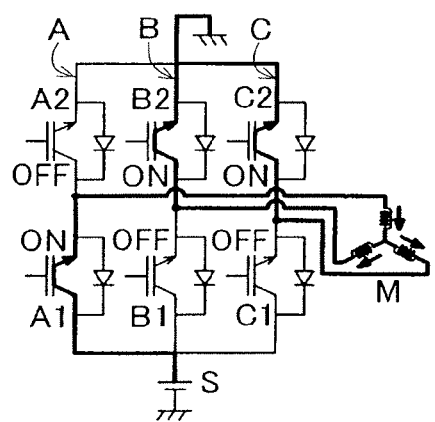
FIG. 9H shows the example of the three-phase power supply in which power is supplied to the motor M using the power supply device 80.
Figure 9I:
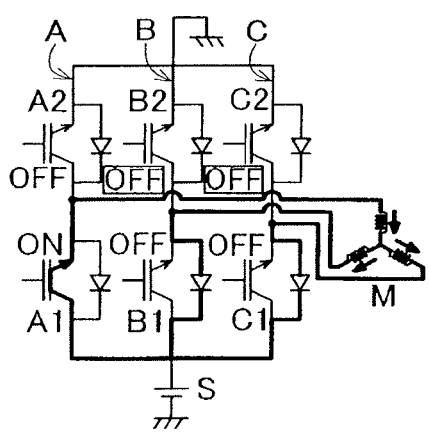
FIG. 9I shows the example of the three-phase power supply in which power is supplied to the motor M using the power supply device 80.
Figure 10A:
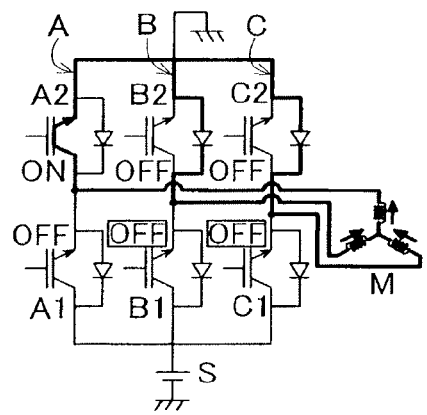
FIG. 10A shows another example of a three-phase power supply in which power is supplied to the motor M using the power supply device 80.
Figure 10B:
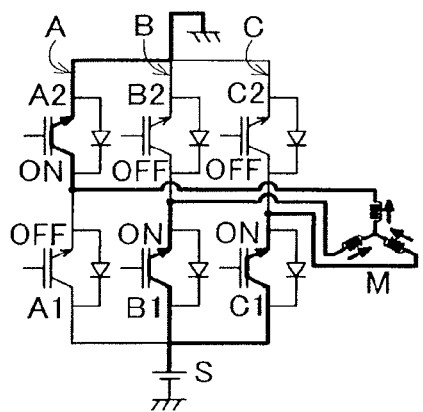
FIG. 10B shows the other example of the three-phase power supply in which power is supplied to the motor M using the power supply device 80.
Figure 10C:
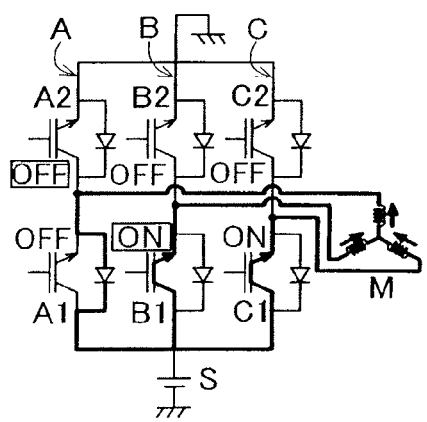
FIG. 10C shows the other example of the three-phase power supply in which power is supplied to the motor M using the power supply device 80.
Figure 10D:
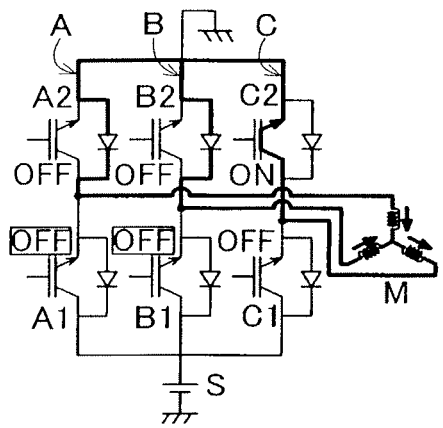
FIG. 10D shows the other example of the three-phase power supply in which power is supplied to the motor M using the power supply device 80.
Figure 10E:
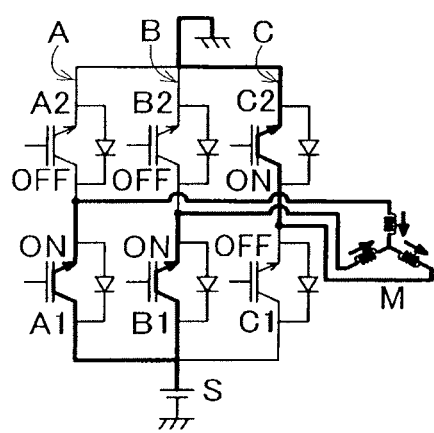
FIG. 10E shows the other example of the three-phase power supply in which power is supplied to the motor M using the power supply device 80.
Figure 10F:
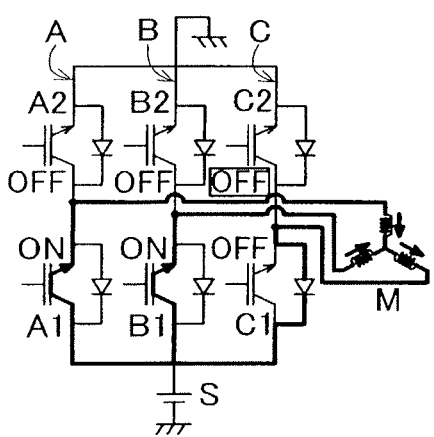
FIG. 10F shows the other example of the three-phase power supply in which power is supplied to the motor M using the power supply device 80.
Figure 10G:
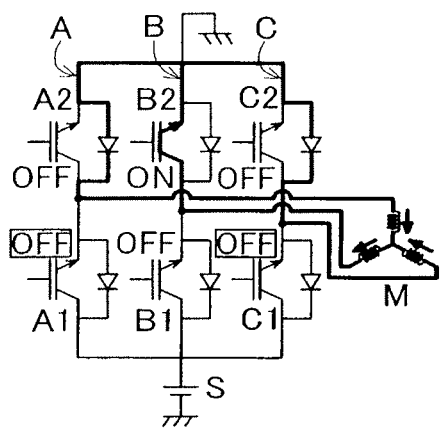
FIG. 10G shows the other example of the three-phase power supply in which power is supplied to the motor M using the power supply device 80.
Figure 10H:
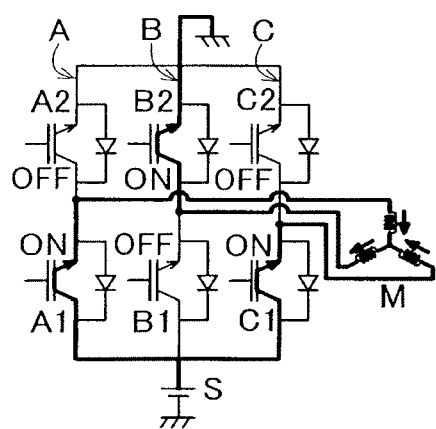
FIG. 10H shows the other example of the three-phase power supply in which power is supplied to the motor M using the power supply device 80.
Figure 10I:
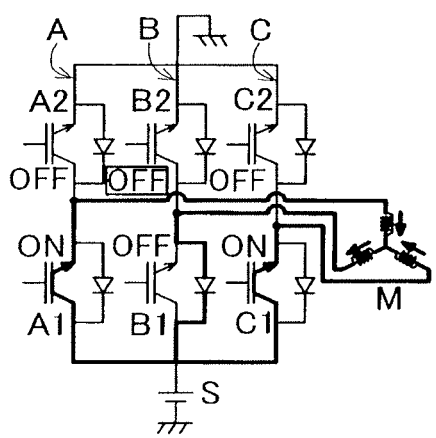
FIG. 10I shows the other example of the three-phase power supply in which power is supplied to the motor M using the power supply device 80.
Figure 11A:
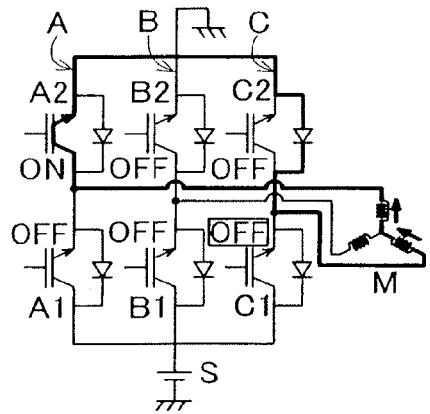
FIG. 11A shows yet another example of a three-phase power supply in which power is supplied to the motor M using the power supply device 80.
Figure 11B:
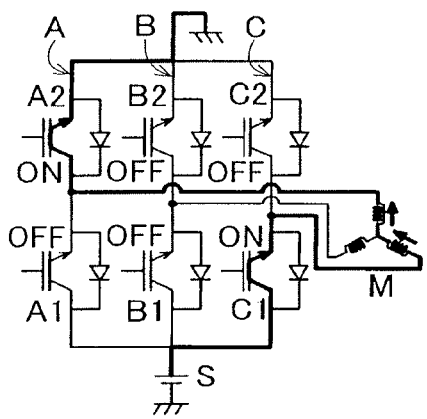
FIG. 11B shows the yet other example of the three-phase power supply in which power is supplied to the motor M using the power supply device 80.
Figure 11C:
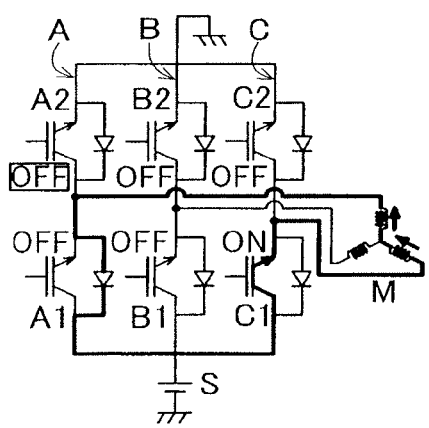
FIG. 11C shows the yet other example of the three-phase power supply in which power is supplied to the motor M using the power supply device 80.
Figure 11D:
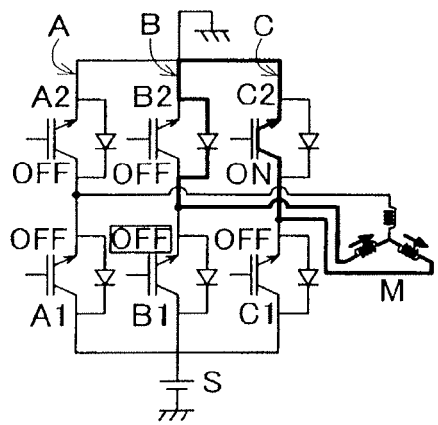
FIG. 11D shows the yet other example of the three-phase power supply in which power is supplied to the motor M using the power supply device 80.
Figure 11E:
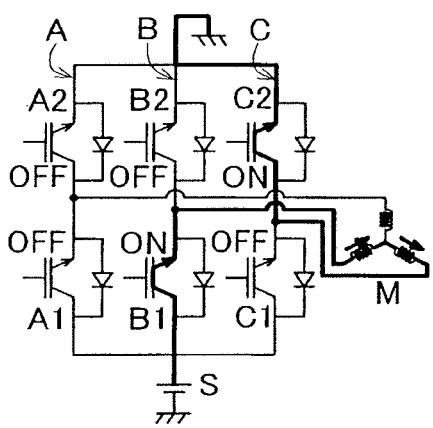
FIG. 11E shows the yet other example of the three-phase power supply in which power is supplied to the motor M using the power supply device 80.
Figure 11F:
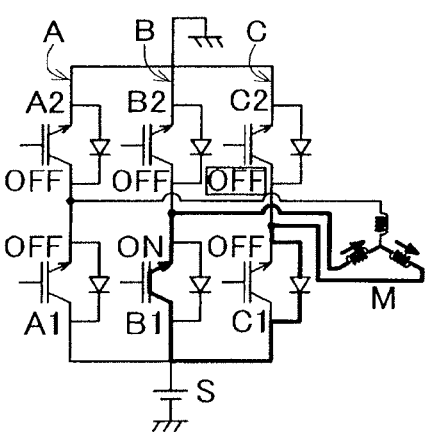
FIG. 11F shows the yet other example of the three-phase power supply in which power is supplied to the motor M using the power supply device 80.
Figure 11G:
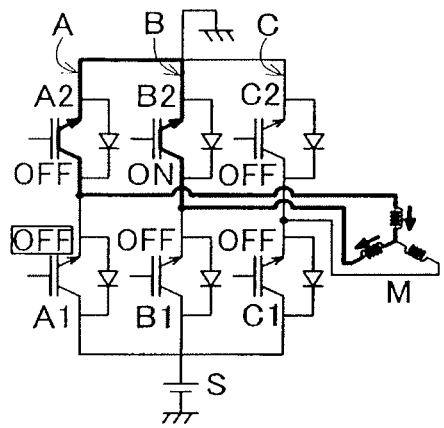
FIG. 11G shows the yet other example of the three-phase power supply in which power is supplied to the motor M using the power supply device 80.
Figure 11H:
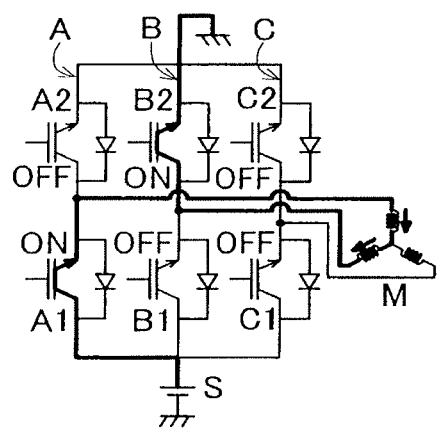
FIG. 11H shows the yet other example of the three-phase power supply in which power is supplied to the motor M using the power supply device 80.
Figure 11I:
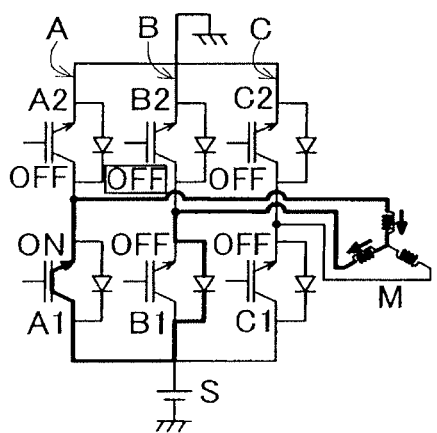
FIG. 11I shows the yet other example of the three-phase power supply in which power is supplied to the motor M using the power supply device 80.

FIG. 7 shows a block diagram of a gate voltage control circuit 418 further provided with an input port 58 and a power supply device 402 driven by the gate voltage control circuit 418. The power supply device 402 shown in FIG. 7 is connected to the reverse conducting semiconductor devices 10a, 10b, 10c and 10d, and is further provided with current measuring elements 60a, 60b, 60c and 60d capable of measuring the value of current that flows to the reverse conducting semiconductor devices 10a, 10b, 10c and 10d. Output terminals 62a, 62b, 62c and 62d that output signals that convey the current magnitudes are formed in the current measuring elements 60a, 60b, 60c and 60d. In addition, the input port 58 is formed in the gate voltage control circuit 418 shown in FIG. 7, and is connected to the output terminals 62. The CPU 52 is connected to all input wires respectively and independently through the input port 58. The CPU 52 is able to apply voltages at an accurate timing corresponding to the outputs from the current measuring elements 60a, 60b, 60c and 60d upon applying voltages to the trench gate electrodes 26a, 26b, 26c and 26d through the output voltage generation unit 54.

Although the above description has provided an explanation of the case of a single phase illustrated in FIG. 8, the present teachings are also effective in the case of three phases as illustrated in FIGS. 9 to 11. There are no limitations on the number of phases of the power supply circuit.

The specific embodiment of the present teachings is described above, but merely illustrates some possibilities of the teachings and do not restrict the scope as claimed. The art set forth in the claims includes variations and modifications of the specific examples set forth above. Some examples of the variations and modifications will be given below.

The technical contents disclosed in the specification or the drawings may be utilized separately or in all types of combinations, and are not limited to the combinations set forth in the claims at the time of filing of the application. Furthermore, the art disclosed herein may be utilized to simultaneously achieve a plurality of aims or to achieve one of these aims.

What is claimed is:

1. A method for driving a power supply device including a plurality of reverse conducting semiconductor devices used in combination, wherein:
    each reverse conducting semiconductor device includes an IGBT (insulated gate bipolar transistor) domain and a diode element domain coexisting in a semiconductor substrate,
    in the IGBT domain, an emitter region, a body region, a drift region and a collector region are layer-stacked, and a trench gate electrode penetrating the body region that separates the emitter region from the drift region is formed, and
    in the diode element domain, a body contact region, a body region, a drift region and a drift contact region are layer-stacked and a trench gate electrode extending from a surface of the semiconductor substrate to the drift region is formed,
    the driving method comprising:
    applying a first polarity voltage at least to the trench gate electrode of the IGBT domain of one reverse conducting semiconductor device in a case where an electric power is to be supplied by switching the IGBT domain of the one reverse conducting semiconductor device to an on-state; and
    applying a second polarity voltage at least to the trench gate electrode of the diode element domain of another reverse conducting semiconductor device in a case where return current flows in the diode element domain of the other reverse conducting semiconductor device by switching the IGBT domain of the one reverse conducting semiconductor device to an off-state.

2. A method of driving as set forth in claim 1, wherein the applying of the second polarity voltage at least to the trench gate electrode of the diode element domain of the other reverse conducting semiconductor device is stopped before the IGBT domain of the one reverse conducting semiconductor device is switched back to the on-state from the off-state.

3. A method for driving a power supply device including three or more reverse conducting semiconductor devices used in combination, wherein:
    each reverse conducting semiconductor device includes an IGBT (insulated gate bipolar transistor) domain and a diode element domain coexisting in a semiconductor substrate,
    in the IGBT domain, an emitter region, a body region, a drift region and a collector region are layer-stacked, and a trench gate electrode penetrating the body region that separates the emitter region from the drift region is formed, and
    in the diode element domain, a body contact region, a body region, a drift region and a drift contact region are layer-stacked, and a trench gate electrode extending from a surface of the semiconductor substrate to the drift region is formed,
    the driving method comprising:
    applying a first polarity voltage at least to the trench gate electrodes of the IGBT domains of at least two reverse conducting semiconductor devices in a case where an electric power is to be supplied by switching the IGBT domains of the at least two reverse conducting semiconductor devices to an on-state;
    switching one of the IGBT domains of the at least two reverse conducting semiconductor devices to an off-state and maintaining another of the IGBT domains of the at least two reverse conducting semiconductor devices in the on-state, so that return current flows in a diode element domain of a third reverse conducting semiconductor device that is different from the at least two reverse conducting semiconductor devices; and
    applying a second polarity voltage at least to the trench gate electrode of the diode element domain of the third reverse conducting semiconductor device after the one of the IGBT domains of the at least two reverse conducting semiconductor devices is switched back to the on-state from the off-state.

4. A power supply device for connecting to a power source and a load and supplying the load with an electric power, the power supply device comprising:
    a parallel circuit comprised of a plurality of series circuits connected in parallel, wherein each of the plurality of series circuits includes two reverse conducting semiconductor devices connected in series; and
    a gate voltage control circuit configured to control a gate voltage applied to a gate electrode of each reverse conducting semiconductor device;
    wherein each parallel circuit is connected between a first terminal of the power source and a second terminal of the power source,
    an intermediate electric potential point between the two reverse conducting semiconductor devices in each of the plurality of series circuits is connected to the load,
    each reverse conducting semiconductor device includes a switching element and a return current diode connected to the switching element in reverse parallel,
    each reverse conducting semiconductor device has a characteristic that the switching element switches to an on-state when a first polarity voltage is applied to the gate electrode, and a quantity of minority carriers in the return current diode increases when a second polarity voltage is applied to the gate electrode, and
    (A) the gate voltage control circuit controls the gate voltage applied to each gate electrode such that:
        (1) the gate voltage control circuit applies the first polarity voltage to a gate electrode of one reverse conducting semiconductor device on the first terminal side of the intermediate electric potential point of one series circuit, (2) the gate voltage control circuit does not apply the first polarity voltage to a gate electrode of another reverse conducting semiconductor device on the second terminal side of the intermediate electric potential point of the series circuit of (1) above, (3) the gate voltage control circuit does not apply the first polarity voltage to a gate electrode of one reverse conducting semiconductor device on the first terminal side of the intermediate electric potential point of at least one of other series circuits, and (4) the gate voltage control circuit applies the first polarity voltage to a gate electrode of another reverse conducting semiconductor device on the second terminal side of the intermediate electric potential point of the series circuit of (3) above, whereby the electric power is supplied to the load, (B) the gate voltage control circuit orderly changes the series circuit to which the first polarity voltage is applied to the gate electrode of the first terminal side reverse conducting semiconductor device so that a supply direction of the electric power to the load is orderly shifted, and (C) the gate voltage control circuit further applies the second polarity voltage to the gate electrode of (2) above when the application of the first polarity voltage to the gate electrode of (1) above is stopped.

5. A power supply device as set forth in claim 4, wherein the gate voltage control circuit applies the second polarity voltage to the gate electrode of (2) above simultaneous to a timing when the application of the first polarity voltage to the gate electrode is stopped in (C) above.

6. A power supply device as set forth in claim 4, wherein the gate voltage control circuit measures an amount of current in the reverse conducting semiconductor device of (2) above, and the gate voltage control circuit applies the second polarity voltage to the gate electrode of (2) above simultaneous to a timing when the current begins to flow in the reverse conducting semiconductor device of (2) above.

7. A power supply device as set forth in claim 4, wherein the gate voltage control circuit stops application of the second polarity voltage to the gate electrode of (2) above prior to a timing when the first polarity voltage is applied again to the gate electrode to which the application of the first polarity voltage had been stopped in (C) above.

8. A power supply device as set forth in claim 5, wherein the gate voltage control circuit stops application of the second polarity voltage to the gate electrode of (2) above prior to a timing when the first polarity voltage is applied again to the gate electrode to which the application of the first polarity voltage had been stopped in (C) above.

9. A power supply device as set forth in claim 6, wherein the gate voltage control circuit stops application of the second polarity voltage to the gate electrode of (2) above prior to a timing when the first polarity voltage is applied again to the gate electrode to which the application of the first polarity voltage had been stopped in (C) above.

10. A power supply device for connecting to a power source and a load and supplying the load with electric power, the power supply device comprising:

a parallel circuit comprised of a plurality of series circuits connected in parallel, wherein each of the plurality of series circuits includes two reverse conducting semiconductor devices connected in series; and a gate voltage control circuit configured to control a gate voltage applied to a gate electrode of each reverse conducting semiconductor device;

wherein each parallel circuit is connected between a first terminal of the power source and a second terminal of the power source, an intermediate electric potential point between the two reverse conducting semiconductor devices in each of the plurality of series circuits is connected to the load, each reverse conducting semiconductor device includes a switching element and a return current diode connected to the switching element in reverse parallel, and each reverse conducting semiconductor device has a characteristic that the switching element switches to an on-state when a first polarity voltage is applied to the gate electrode, and a quantity of minority carries in the return current diode increases when a second polarity voltage is applied to the gate electrode, and (A) the gate voltage control circuit controls the gate voltage applied to each gate electrode such that:

(1) the gate voltage control circuit applies the first polarity voltage to a gate electrode of one reverse conducting semiconductor device on the first terminal side of the intermediate electric potential point of one series circuit, (2) the gate voltage control circuit does not apply the first polarity voltage to a gate electrode of another reverse conducting semiconductor device on the second terminal side of the intermediate electric potential point of the series circuit of (1) above, (3) the gate voltage control circuit does not apply the first polarity voltage to a gate electrode of one reverse conducting semiconductor device on the first terminal side of the intermediate electric potential point of at least one of other series circuits, and (4) the gate voltage control circuit applies the first polarity voltage to a gate electrode of another reverse conducting semiconductor device on the second terminal side of the intermediate electric potential point of the series circuit of (3) above, whereby the electric power is supplied to the load, (B) the gate voltage control circuit orderly changes the series circuit to which the first polarity voltage is applied to the gate electrode of the first terminal side reverse conducting semiconductor device so that a supply direction of the electric power to the load is orderly shifted, and (D) the gate voltage control circuit maintains the application of the first polarity voltage to the gate electrode of (4) above when the gate voltage control circuit stops the application of the first polarity voltage to the gate electrode of (1) above, so that return current flows in the return current diode of the reverse conducting semiconductor device of (2) above, and (E) subsequent to a timing when the gate voltage control circuit applies the first polarity voltage again to the gate electrode to which the application of the first polarity voltage had been stopped in (D) above, the gate voltage control circuit applies the second polarity voltage to the gate electrode of the reverse conducting semiconductor device in which the return current had flown in (D) above.

11. A power supply device for connecting to a power source and a load and supplying the load with electric power, the power supply device comprising:

a parallel circuit comprised of a plurality of series circuits connected in parallel, wherein each of the plurality of series circuits includes a plurality of composition circuits connected in series;

a switch circuit configured to switch a state of each switching element of each composition circuit between an on-state and an off-state; and a voltage control circuit configured to control a voltage applied to a electrode of each return current diode of each composition circuit;

wherein each parallel circuit is connected between a first terminal of the power source and a second terminal of the power source, an intermediate electric potential point of each series circuit is connected to the load, each composition circuit includes a switching element and a return current diode having an electrode for increasing a quantity of minority carriers in accordance with an applied voltage connected in reverse parallel; and (A) the switch circuit switches the state of each switching element, such that:
  (1) the switch circuit switches a switching element on the first terminal side of the intermediate electric potential point of one series circuit to the on-state,
  (2) the switch circuit switches a switching element on the second terminal side of the intermediate electric potential point of the series circuit of (1) above to the off-state,
  (3) the switch circuit switches a switching element on the first terminal side of the intermediate electric potential point of at least one of other series circuits to the off-state,
  (4) the switch circuit switches a switching element on the second terminal side of the intermediate electric potential point of the series circuit of (3) above to the on-state, whereby the electric power is supplied to the load, (B) the switch circuit orderly changes the series circuit of which the state of the switching element on the first terminal side of the intermediate electric potential point is switched to the on-state so that a supply direction of the electric power to the load is orderly shifted, and (C) the voltage control circuit applies a voltage with a polarity to increase the quantity of the minority carriers on the electrode of the return current diode connected in reverse parallel to the switching element of (2) above when the switching element that had been switched to the on-state in (1) above is switched to the off-state.

12. A power supply device as set forth in claim 11, wherein the voltage control circuit stops the application of the voltage with the polarity to increase the quantity of the minority carriers to the electrode of the return current diode connected in reverse parallel to the switching element of (2) above, prior to a timing when the switching element that had been switched to the off-state in (C) above is switched back to the on-state.

13. A power supply device for connecting to a power source and a load and supplying the load with electric power, the power supply device comprising:

a parallel circuit comprised of a plurality of series circuits connected in parallel, wherein each of the plurality of series circuits includes a plurality of composition circuits connected in series;

a switch circuit configured to switch a state of each switching element of each composition circuit between an on-state and an off-state; and a voltage control circuit configured to control a voltage applied to a electrode of each return current diode of each composition circuit;

wherein each parallel circuit is connected between a first terminal of the power source and a second terminal of the power source, an intermediate electric potential point of each series circuit is connected to the load, each composition circuits includes a switching element and a return current diode having an electrode for increasing a quantity of minority carriers in accordance with an applied voltage connected in reverse parallel; and (A) the switch circuit switches the state of each switching element, such that:
  (1) the switch circuit switches a switching element on the first terminal side of the intermediate electric potential point of one series circuit to the on-state,
  (2) the switch circuit switches a switching element on the second terminal side of the intermediate electric potential point of the series circuit of (1) above to the off-state,
  (3) the switch circuit switches a switching element on the first terminal side of the intermediate electric potential point of at least one of other series circuits to the off-state,
  (4) the switch circuit switches a switching element on the second terminal side of the intermediate electric potential point of the series circuit of (3) above to the on-state, whereby the electric power is supplied to the load, (B) the switch circuit orderly changes the series circuit of which the state of the switching element on the first terminal side of the intermediate electric potential point is switched to the on-state so that a supply direction of the electric power to the load is orderly shifted, and (D) the switch circuit maintains the switching element of (4) above in the on-state when the switch circuit switches the switching element that had been switched to the on-state in (1) above to the off-state, so that return current flows in the return current diode that is connected in reverse parallel to the switching element of (2) above, and subsequent to a timing when the switch circuit switches the switching element that had been switched to the off-state in (D) above back to the on-state, the voltage control circuit applies a voltage with a polarity to increase the quantity of the minority carriers to the electrode of the return current diode in which the return current flown in (D) above.

* * * * *